(12) United States Patent
Maxey et al.

(10) Patent No.: US 12,349,438 B2
(45) Date of Patent: Jul. 1, 2025

(54) CONTACT GATING FOR 2D FIELD EFFECT TRANSISTORS

(71) Applicant: Intel Corporation, Santa Clara, CA (US)

(72) Inventors: Kirby Maxey, Hillsboro, OR (US); Ashish Verma Penumatcha, Beaverton, OR (US); Carl Naylor, Portland, OR (US); Chelsey Dorow, Portland, OR (US); Kevin O'Brien, Portland, OR (US); Shriram Shivaraman, Hillsboro, OR (US); Tanay Gosavi, Portland, OR (US); Uygar Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 769 days.

(21) Appl. No.: 17/485,153

(22) Filed: Sep. 24, 2021

(65) Prior Publication Data

US 2023/0100451 A1 Mar. 30, 2023

(51) Int. Cl.
*H10D 64/23* (2025.01)
*H10D 62/80* (2025.01)
*H10D 64/01* (2025.01)
*H10D 64/27* (2025.01)
*H10D 84/83* (2025.01)

(52) U.S. Cl.
CPC .......... *H10D 64/258* (2025.01); *H10D 62/80* (2025.01); *H10D 64/01* (2025.01); *H10D 64/513* (2025.01); *H10D 84/83* (2025.01)

(58) Field of Classification Search
CPC ......... H10D 30/47; H10D 30/481–485; H10D 30/43–435; H10D 62/119–123; H10D 30/014; H10D 30/501–509; H10D 30/6215; H10D 30/6217; Y10S 977/938
See application file for complete search history.

(56) References Cited

U.S. PATENT DOCUMENTS

| 10,388,732 B1 | 8/2019 | Frougier et al. |
| 2016/0020305 A1 | 1/2016 | Obradovic et al. |

(Continued)

FOREIGN PATENT DOCUMENTS

| EP | 3104416 | 12/2016 |
| EP | 3985740 | 4/2022 |

OTHER PUBLICATIONS

Extended European Search Report from European Patent Application No. 22191307.2 notified Feb. 16, 2023, 8 pgs.

(Continued)

*Primary Examiner* — Evren Seven
*Assistant Examiner* — Cole Leon Lindsey
(74) *Attorney, Agent, or Firm* — Essential Patents Group, LLP

(57) ABSTRACT

Transistors, devices, systems, and methods are discussed related to transistors including a number of 2D material channel layers and source and drain control electrodes coupled to source and drain control regions of the 2D material channels. The source and drain control electrodes are on opposite sides of a gate electrode, which controls a channel region of the 2D material channels. The source and drain control electrodes provide for reduced contact resistance of the transistor, the ability to create complex logic gates, and other advantages.

21 Claims, 17 Drawing Sheets

(56) References Cited

U.S. PATENT DOCUMENTS

| | | |
|---|---|---|
| 2016/0300958 A1 | 10/2016 | Park et al. |
| 2019/0131437 A1* | 5/2019 | Le .................. H10D 62/402 |
| 2019/0287800 A1* | 9/2019 | Yamaguchi ....... H01L 21/02491 |
| 2020/0058743 A1 | 2/2020 | Li et al. |

OTHER PUBLICATIONS

Shen, Pin-Chun, et al., "Ultralow contact resistance between semimetal and monolayer semiconductors", Nature, vol. 593, May 13, 2021, 21 pgs.

Wang, Brian, "Breakthrough Toward Below 1 Nanometer Chips", <https://www.nextbigfuture.com/2021/05/breakthrough-to-below-1-nanometer-chips.html> May 21, 2021, 8 pgs.

\* cited by examiner

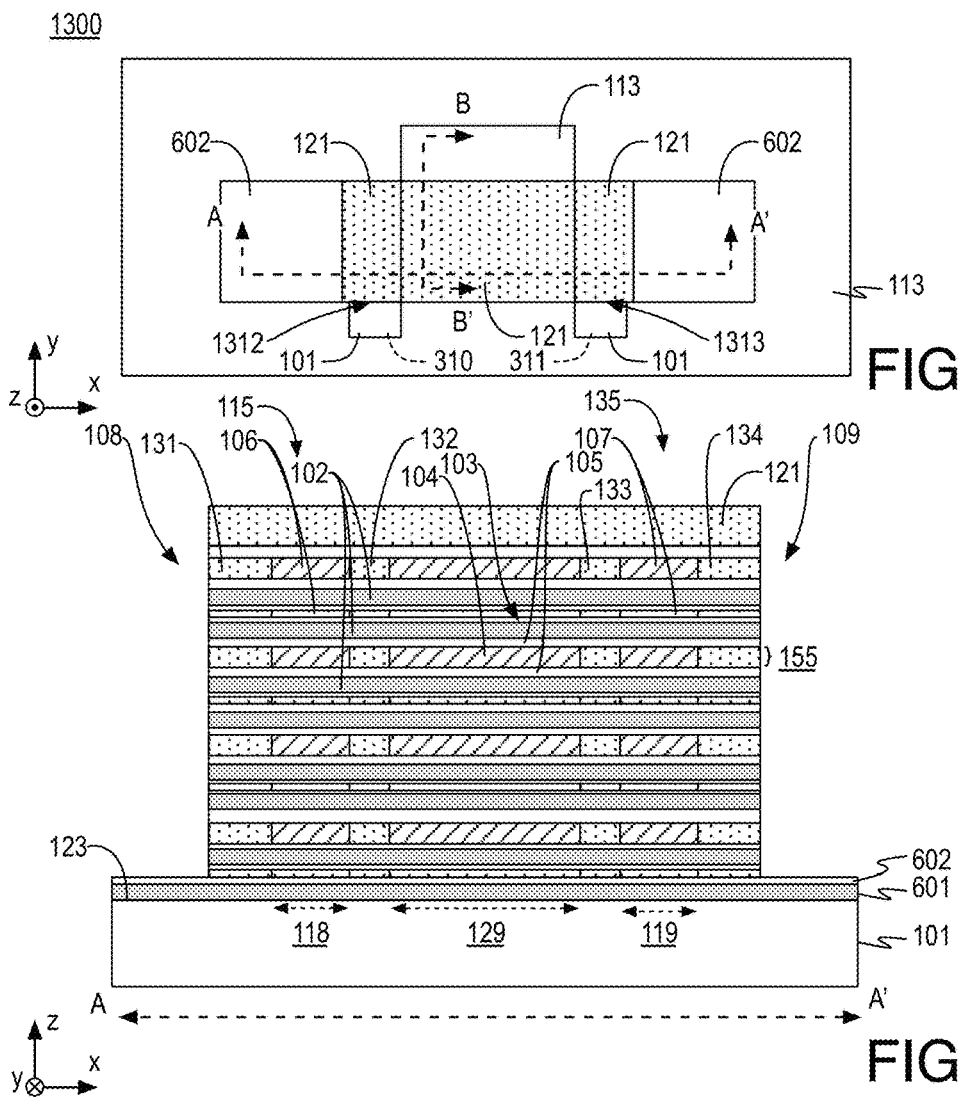
FIG. 13A
FIG. 13B
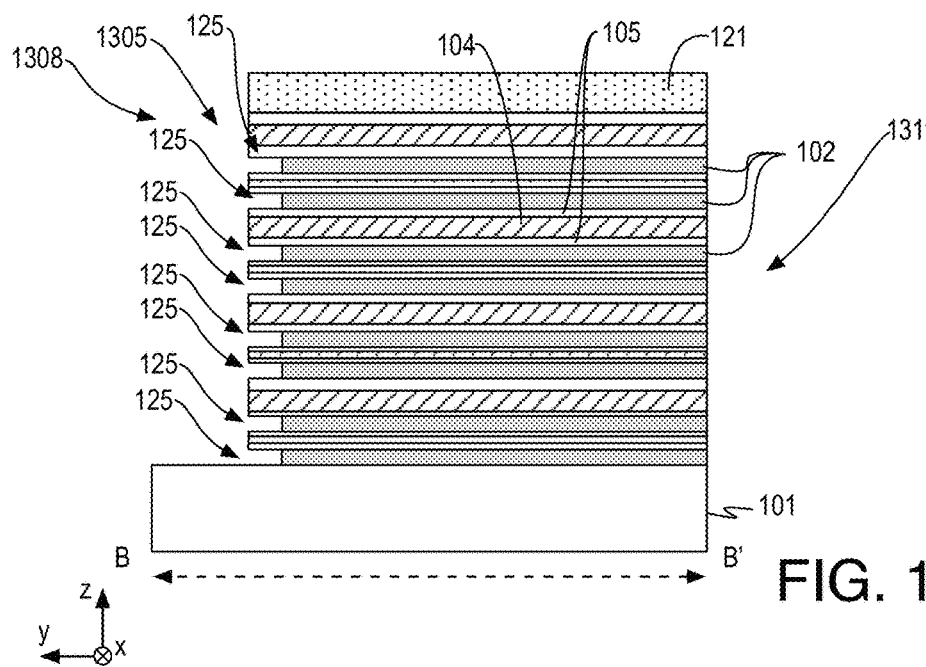
FIG. 13C

CONTACT GATING FOR 2D FIELD EFFECT TRANSISTORS

BACKGROUND

Demand for integrated circuits (ICs) in electronic applications has motivated research into new materials for advanced transistor devices. For example, materials to replace the silicon channel of traditional transistors are being sought. Semiconductor transistors deploying 2D channel materials are promising for applications unattainable by silicon such as heterogeneous back end of line (BEOL) compatible integration and many others. However, challenges arise in deploying 2D materials such as contact resistances.

It is desirable to deploy transistors with 2D channel materials for improved device performance. It is with respect to these and other considerations that the present improvements have been needed. Such improvements may become critical as the need for higher performance integrated circuit electronic devices becomes more widespread.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 3A, 4A, 5A, 6A, 7A, 8A, 9A, 10A, 11A, 12A, 13A, 14A, and 15A illustrate top down views of example transistor structures as particular fabrication operations of the process of FIG. 2 are performed;

FIGS. 3B, 4B, 5B, 6B, 7B, 8B, 9B, 10B, 11B, 12B, 13B, 14B, and 15B illustrate cross-sectional side views of the transistor structures of FIGS. 3A, 4A, 5A, 6A, 7A, 8A, 9A, 10A, 11A, 12A, 13A, 14A, and 15A taken along the channel thereof;

FIGS. 3C, 4C, 5C, 6C, 7C, 8C, 9C, 10C, 11C, 12C, 13C, 14C, and 15C illustrate cross-sectional side views of the transistor structures of FIGS. 3A, 4A, 5A, 6A, 7A, 8A, 9A, 10A, 11A, 12A, 13A, 14A, and 15A taken across the gate thereof;

DETAILED DESCRIPTION

Figure 1A:
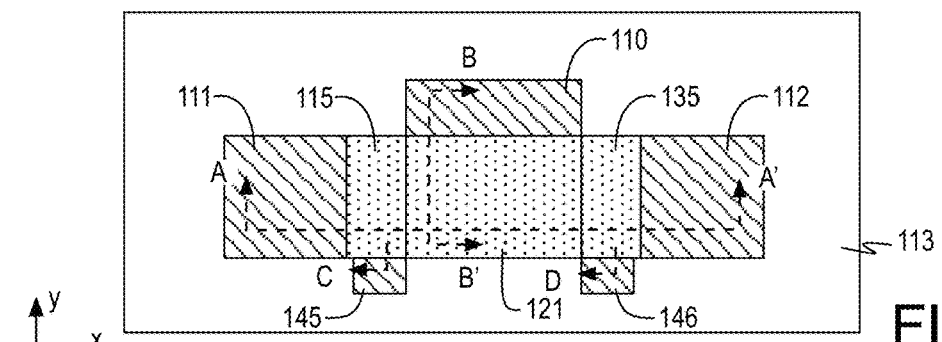
FIG. 1A illustrates a top down view of an exemplary transistor structure having source and drain control electrodes to control semiconductor material in source and drain regions.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other.

Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Transistor structures, device structures, apparatuses, integrated circuits, computing platforms, and methods are described herein related to transistors having a number of 2D material channel semiconductors and contact gating to increase the number of carriers in the contact region semiconductor.

As discussed, it is desirable to reduce contact resistance in 2D transistors. Embodiments discussed herein provide 2D transistors having intrinsic channel quality 2D materials such that the channel semiconductor is contacted, on opposite lateral ends, by source and drain contacts (e.g., contact metal). As used herein, the term 2D material indicates a crystalline solid made up of any number of layers of single 2D layers (e.g., monolayers or nano sheets) such as one, two, three, or more 2D layers with one or two layers being particularly advantageous. Furthermore, gate electrodes are between the source and drain contacts to control the channel materials of the transistor device. Between the source contact and the gate electrodes, a number of source control electrodes (or electrode layers) are provided. Similarly, a number of drain control electrodes (or electrode layers) are provided between the drain contact and the gate electrodes. Each of the source and drain control electrodes are coplanar with one of the gate electrodes and separated from the gate electrodes by dielectric fill materials or plugs. The source and drain control electrodes are coupled to a source control gate contact and a drain control gate contact, respectively. As used herein, the term source or drain control electrode indicates a component of the transistor device adjacent to a semiconductor material (and separated by a dielectric material) for control of the semiconductor material in the source or drain region. The term source or drain control gate contact indicates a conductor (e.g., metal) that is coupled to and contacts the source or drain control electrode. The source or drain control gate contacts provide a terminal or terminals of the device. Similarly, a gate contact (e.g., metal) couples to and contacts a gate electrode, a source contact (e.g., metal) couples to and contacts a source side (or interface) of a semiconductor channel, and a drain contact (e.g., metal) couples to and contacts a drain side (or interface) of a semiconductor channel. Notably, the source or drain control gate contact may be characterized as a control gate contact, a control gate, or the like and may be differentiated from the gate contact of the device as the gate contact accesses control of the channel region of the semiconductor material while the control gate contact accesses control of a source or drain region of the semiconductor material.

In some embodiments, the source and drain control gate contacts may be controlled by a same terminal of the device (e.g., the source and drain regions may be biased or controlled together). In such embodiments, a four terminal transistor or device may be provided having the following terminals: source, drain, gate, and control gate. By deploying a four-terminal device with the fourth contact being a contact gate, devices may deploy such devices to create effective logic gates with fewer transistors than would be needed using three terminal devices. In some embodiments, the contact may be used to reduce contact resistance in the 2D semiconductors for normal transistor operation by thinning the Schottly barrier present in this region. Other advantages will be evident based on the present disclosure. Furthermore, the techniques discussed herein advantageously integrate such contact gates in a manner compatible with a stacked 2D semiconductor (e.g., nanoribbon) fabrication flow to provide required ON current per area footprint for deployment in advanced devices.

Figure 1B:
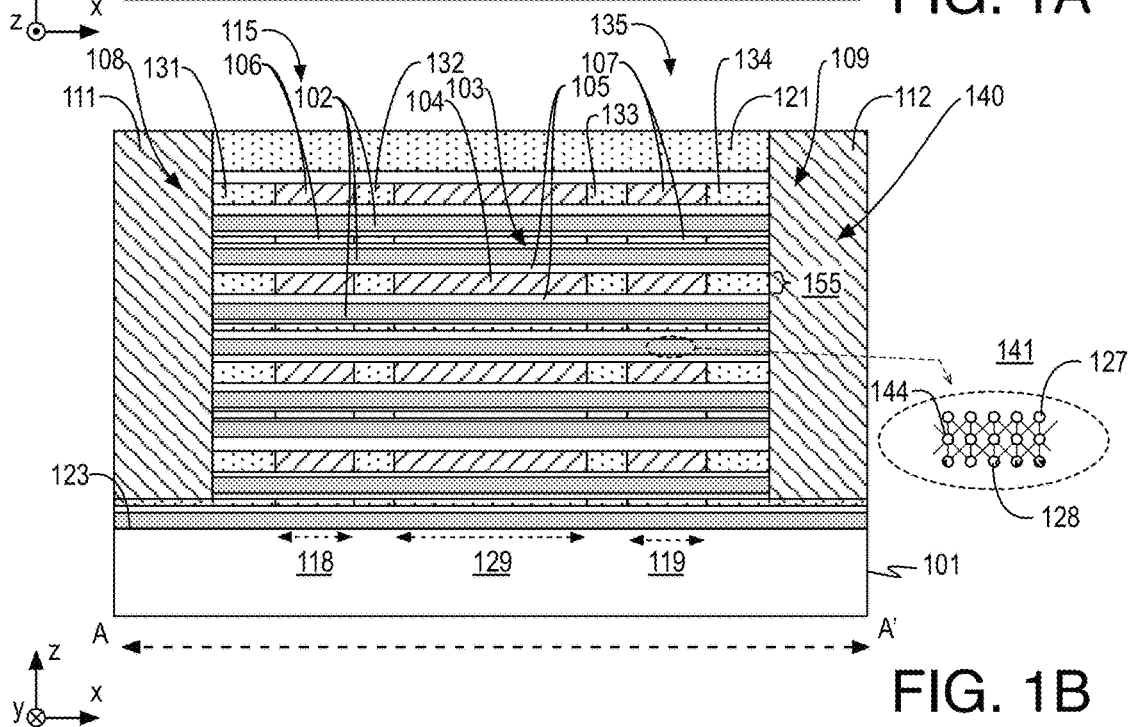
FIG. 1B provides illustration of a cross-sectional side view of the transistor structure of FIG. 1A taken along the channel thereof.
Figure 1C:
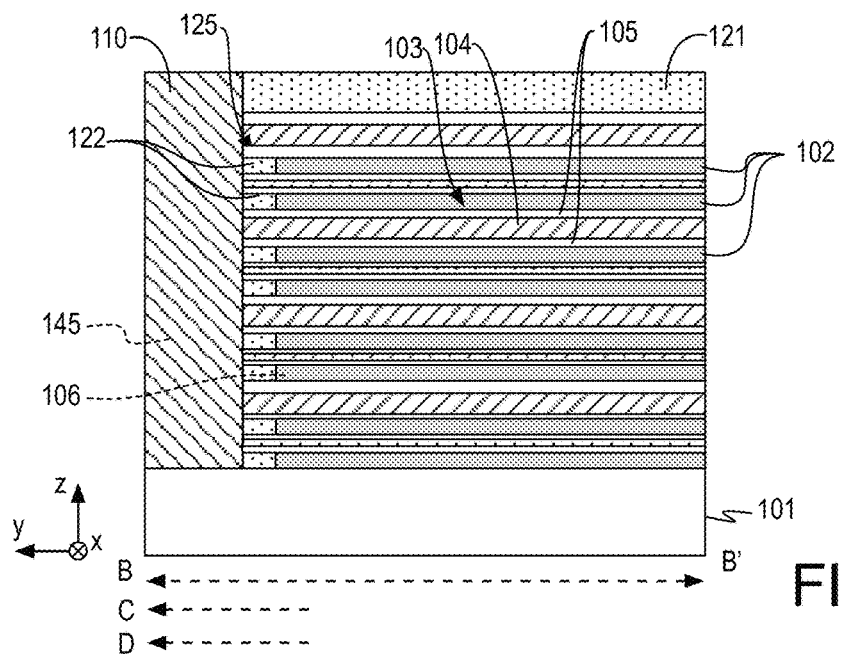
FIG. 1C provides illustration of a cross-sectional side view of the transistor structure of FIG. 1A taken across the gate thereof.

FIGS. 1A, 1B, and 1C provide illustrative views of an exemplary transistor structure 100 having source and drain control electrodes to control semiconductor material in source and drain regions, arranged in accordance with at least some implementations of the present disclosure. FIG. 1A illustrates a top down view of transistor structure 100, FIG. 1B illustrates a cross-sectional side view of transistor structure 100 taken along the A-A' plane illustrated in FIG. 1A (e.g., along the channel of transistor structure 100), and FIG. 1C illustrates a cross-sectional side view of transistor structure 100 taken along the B-B' plane illustrated in FIG. 1A (e.g., across the gate of transistor structure 100). Such convention is maintained in subsequent FIGS. 3 to 15. It is noted that the left side of the view taken along the B-B' plane is similar to that of the partial planes C and D illustrated in FIG. 1A as discussed further herein.

Transistor structure 100 includes a field insulator 113 (e.g., an oxide) over substrate 101 with a source contact 111, a material stack 140, a drain contact 112, a gate contact 110, and control gate contacts 145, 146 within an opening of field insulator 113. Source contact 111 contacts semiconductor channel layers 102 at one lateral end 108 of material stack 140 and drain contact 112 contacts semiconductor channel layers 102 at lateral end 109 of material stack 140 such that source contact 111 and drain contact 112 are on opposite lateral ends 108, 109 of material stack 140. The direction between source contact 111 and drain contact 112 (i.e., the x-direction) establishes a channel electron flow of transistor structure 100. As used herein, the term lateral indicates a direction substantially parallel to a surface 123 of substrate 101 and perpendicular to a build up direction of transistor structure 100. For example, the lateral direction is in the x-y plane and the build up direction is in the direction of the z-axis defined in FIGS. 1 and 3 to 15. Gate contact 110 contacts gate electrode layers 104 to control channel regions 129 between source contact 111 and drain contact 112. Source control gate contact 145 contacts source control electrodes 106 to control source region 118 between source contact 111 and gate electrode layers 104 and drain control gate contact 146 contacts drain control electrodes 107 to control drain regions 119 between gate electrode layers 104 and drain contact 112. Notably, source regions 118 are within a region 115 between source contact 111 and channel regions 129 and drain regions 119 are within a region 135 between drain contact 112 and channel regions 129.

As shown in FIG. 1C, gate contact 110 contacts each of gate electrode layers 104 while being electrically separated from semiconductor channel layers 102 by dielectric fills or plugs 122. In a similar manner, source control gate contact 145 contacts each of source control electrodes 106 while being separated from semiconductor channel layers 102 by dielectric fills or plugs. Such processing is discussed further herein. As shown with respect to FIG. 1A, the left side of the view taken along the B-B' plane is similar to that of the partial plane C. Notably, the partial plane C includes source control gate contact 145 in place of gate contact 110 and source control electrodes 106 in place of gate electrode layers 104 with dielectric fills or plugs 122 separating and electrically isolating source control gate contact 145 from semiconductor channel layers 102. Similar structures are provided with respect to drain control electrodes 107 and drain control gate contact 146 taken at partial plane D.

Source contact 111, drain contact 112, gate contact 110, source control gate contact 145, and drain control gate contact 146 may include any suitable material(s) and may be formed together (as illustrated herein below for the sake of clarity of presentation) or with gate contact 110, source control gate contact 145, and drain control gate contact 146 being formed in separate operations with respect to source contact 111 and drain contact 112. In some embodiments, gate contact 110 includes a gate material selected to provide a work function material suitable for transistor structure 100. In some embodiments, source contact 111 and drain contact 112 include one or more noble metals such as gold, silver, platinum, or palladium. Other materials may be used. Notably, gate contact 110, source contact 111, drain contact 112, source control gate contact 145, and drain control gate contact 146 are polycrystalline materials while the materials of semiconductor channel layers 102 are substantially crystalline. As used herein the term crystalline indicates a solid having a highly (although not necessarily perfectly) ordered structure such as a crystalline lattice structure.

Substrate 101 may include any suitable material or materials. In some embodiments, substrate 101 includes a Group IV material (e.g., silicon). In some embodiments, substrate 101 is a substantially monocrystalline material. Material stack 140 includes a stack of layers including alternating or interleaved semiconductor channel layers 102 and gate layers 103 therebetween with each of gate layers 103 including a gate electrode layer 104 between dielectric layers 105. Material stack 140 may also include optional capping layer 121. Gate electrode layers 104 may include any gate metal (GM) material. Examples of gate electrode layer 104 materials include metals such as ruthenium, palladium, platinum, cobalt, nickel, hafnium, zirconium, titanium, tantalum, aluminum, alloys of these metals, and nitrides or carbides of ruthenium, palladium, platinum, cobalt, nickel, hafnium, zirconium, titanium, tantalum, aluminum such as hafnium nitride, zirconium nitride, titanium nitride, tantalum nitride, and aluminum nitride, hafnium carbide, zirconium carbide, titanium carbide, tantalum carbide or aluminum carbide. Dielectric layers 105 may include any dielectric materials such as high-k (HK) dielectric materials. Examples of dielectric layers 105 materials hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, lead scandium tantalum oxide or lead zinc niobate. Other materials may be deployed.

Each of semiconductor channel layers 102 includes one or more monolayers of 2D material. As discussed, a 2D material indicates a crystalline solid made up of any number of monolayers. Each of such semiconductor channel layers 102 may be characterized as nanoribbon, a nanoribbon sheet, or the like. Examples of semiconductor channel layers 102 materials include transition metal dichalcogenide layers (e.g., including a lattice of transition metal atoms and chalcogen atoms exclusive of oxygen) and similar materials such as indium selenide. Other 2D material layers may be used. In some embodiments, semiconductor channel layers 102 include a transition metal dichalcogenide (TMD) inclusive of a transition metal and a chalcogen. Such TMD material may be doped or undoped. Examples of TMD materials that exhibit N-type behavior include sulfides of Mo or W. Examples of TMD materials that exhibit P-type include, for example, $WSe_2$ or $WSe_2$ doped with Ta. In some embodiments, semiconductor channel layers 102 include molybdenum disulfide (e.g., stoichiometric molybdenum and sulfur, $MoS_2$). In some embodiments, semiconductor channel layers 102 include tungsten disulfide (e.g., stoichiometric tungsten and sulfur, $WS_2$). In some embodiments, semiconductor channel layers 102 include molybdenum diselenide (e.g., stoichiometric molybdenum and selenium, $MoSe_2$). In some embodiments, semiconductor channel layers 102 include tungsten diselenide (e.g., stoichiometric tungsten and selenium, $WSe_2$). In some embodiments, semiconductor channel layers 102 include a 2D material other than TMD. In some embodiments, semiconductor channel layers 102 include indium selenide (e.g., stoichiometric indium and selenium, InSe or $In_2Se_3$).

FIG. 1B includes an insert 141 providing a schematic of a monolayer of TMD material, according to some embodiments. In the illustrative embodiment of insert 141, the TMD material includes a layer of transition metal atoms 144 between layers of chalcogen atoms 127, 128. Depending on arrangements of transition metal atoms 144 and chalcogen atoms 127, 128, the TMD material may have various crystal orientations: trigonal prismatic (hexagonal, as shown, 1H or 2H), octahedral (tetragonal, 1T), or their distorted phase (1T'). A monolayer of TMD (e.g., a TMD nanosheet) may have a thickness of not more than 1 nm. Semiconductor channel layers 102 (e.g., channel nanoribbons or nanosheets) may have one or more such monolayers or nanosheets and semiconductor channel layers 102 may each have a thickness of not more than 2 nm in some embodiments. As discussed, each of semiconductor channel layers 102 may be characterized as a nanoribbon, a sheet, or the like.

With continued reference to FIG. 1B, semiconductor channel layers 102 each couple to source contact 111 and drain contact 112. Each of semiconductor channel layers 102 are between and separated from layers, such as layer 155, by dielectric layers 105, which may be characterized as gate dielectric layers. Notably, dielectric layers 105 separate gate electrode layers 104 (or simply gate electrodes) from semiconductor channel layers 102, source control electrodes 106 from semiconductor channel layers 102, and drain control electrodes 107 from semiconductor channel layers 102.

Each of gate electrode layers 104 and source and drain control electrodes 106, 107 may be biased to control portions of semiconductor channel layers 102 most notably in corresponding channel regions 129, source regions 118, and drain regions 119 of semiconductor channel layers 102.

Source control electrodes 106 are separated and electrically isolated from source contact 111 by dielectric fills or plugs 131, adjacent ones of source control electrodes 106 and gate electrode layers 104 are separated and electrically isolated by dielectric fills or plugs 132, adjacent ones of gate electrode layers 104 and drain control electrodes 107 are separated and electrically isolated by dielectric fills or plugs 133, and drain control electrodes 107 are separated and electrically isolated from drain contact 112 by dielectric fills or plugs 134. Such dielectric fills or plugs 131, 132, 133, 134 may include any dielectric materials such as low-k dielectric materials inclusive of silicon oxide, silicon nitride, and others. For example, dielectric fills or plugs 131, 132, 133, 134 and capping layer 121 may have a lower dielectric constant than dielectric layers 105.

As shown, transistor structure 100 includes a number of semiconductor channel layers 102 interleaved with a number of gate layers 103 such that each of gate layers 103 includes one of gate electrode layers 104 between two of dielectric layers 105 such that semiconductor channel layers 102 include any 2D material discussed herein. Source contact 111 is on (i.e., in direct contact with) lateral end 108 of semiconductor channel layers 102 and drain contact 12 is on (i.e., in direct contact with) lateral end 109 of semiconductor channel layers 102 such that lateral end 109 is opposite lateral end 108. A number of source control electrodes 106, each coplanar with one of the gate electrode layers 104, are laterally between source contact 111 and gate electrode layers 104 and vertically overlapping source regions 118 of semiconductor channel layers 102 and source regions 118 of dielectric layers 105. Source control electrodes 106 are laterally separated from gate electrode layers 104 by dielectric fills or plugs 132. Similarly, a number of drain control electrodes 107, each coplanar with one of the gate electrode layers 104, are laterally between drain contact 112 and gate electrode layers 104 and vertically overlapping drain regions 119 of semiconductor channel layers 102 and dielectric layers 105 with drain control electrodes 107 being separated laterally from gate electrode layers 104 by dielectric fills or plugs 133. As discussed, gate contact 110 is coupled to gate electrode layers 104 (while being isolated from semiconductor channel layers 102 by dielectric fills or plugs 122) and source control gate contact 145 is coupled source control electrodes 106 and drain control gate contact 146 is coupled to drain control electrodes 107 (while also being isolated from semiconductor channel layers 102 by dielectric fills or plugs 122).

Notably, source control electrodes 106 extend laterally, in the y-dimension from source control gate contact 145 across overlapping source regions 118 of semiconductor channel layers 102 and substantially orthogonal to the channel direction of semiconductor channel layers 102, which, as discussed, extends along the x-dimension. In a similar manner, drain control electrodes 107 extend laterally in the y-dimension from drain control gate contact 146 across overlapping drain regions 119 of semiconductor channel layers 102 substantially orthogonal to the channel direction of semiconductor channel layers 102.

Also, as shown with respect to layer 155 in FIG. 1B, dielectric layers 105 extend from source contact 111 to drain contact 112 and a selected one of dielectric layers 105 separates one of source control electrode 106 and one of drain control electrodes 107 from a selected one of semiconductor channel layers 102. Such separation of source control electrode 106 from semiconductor channel layer 102 is at source region 118 of dielectric layer 105. Similarly, separation of drain control electrode 107 from semiconductor channel layer 102 is provided at drain region 119. Such separation, as with separation of gate electrode layers 104 from semiconductor channel layer 102 at channel regions 129 provides control of semiconductor channel layer 102 without shorting the device. Also as shown, a second of dielectric layers 105 is opposite layer 155 with respect to the first of dielectric layers 105 such that the second of dielectric layers 105 is between source and drain control electrodes 106, 107 and gate electrode layer 104 of layer 155 and a second of semiconductor channel layers 102.

In the illustrated embodiment, transistor structure 100 includes both source control electrodes 106 and drain control electrodes 107, which advantageously provides control of both source regions 118 and drain regions 119. In other embodiments, one of source control electrodes 106 or drain control electrodes 107 may be excluded. In embodiments, with both source control electrodes 106 and drain control electrodes 107, as shown, layers of material stack 140 such as layer 155 extends laterally from source contact 111 to drain contact 112. In some embodiments, layer 155 includes one of dielectric fills or plugs 131 on and in direct contact with source contact 111, one of source control electrodes 106 on and in direct contact with one of dielectric fills or plugs 131, one of dielectric fills or plugs 132 (e.g., a second dielectric material) on and in direct contact with one of source control electrodes 106, one of gate electrode layers 104 on and in direct contact with one of dielectric fills or plugs 132, one of dielectric fills or plugs 133 (e.g., a third dielectric material) on and in direct contact with one of gate electrode layers 104, one of drain control electrodes 107 on and in direct contact with one of dielectric fills or plugs 133, and one of dielectric fills or plugs 134 (e.g., a fourth dielectric material) on and in direct contact with one of drain control electrodes 107 and on and in direct contact with one of drain contact 112. As shown, layer 155 of transistor structure 100 is substantially parallel to one of semiconductor channel layers 102 that extends from source contact 111 to drain contact 112 with layer 155 separated from the one of the semiconductor channel layers 102 by one of dielectric layers 105.

Figure 2:
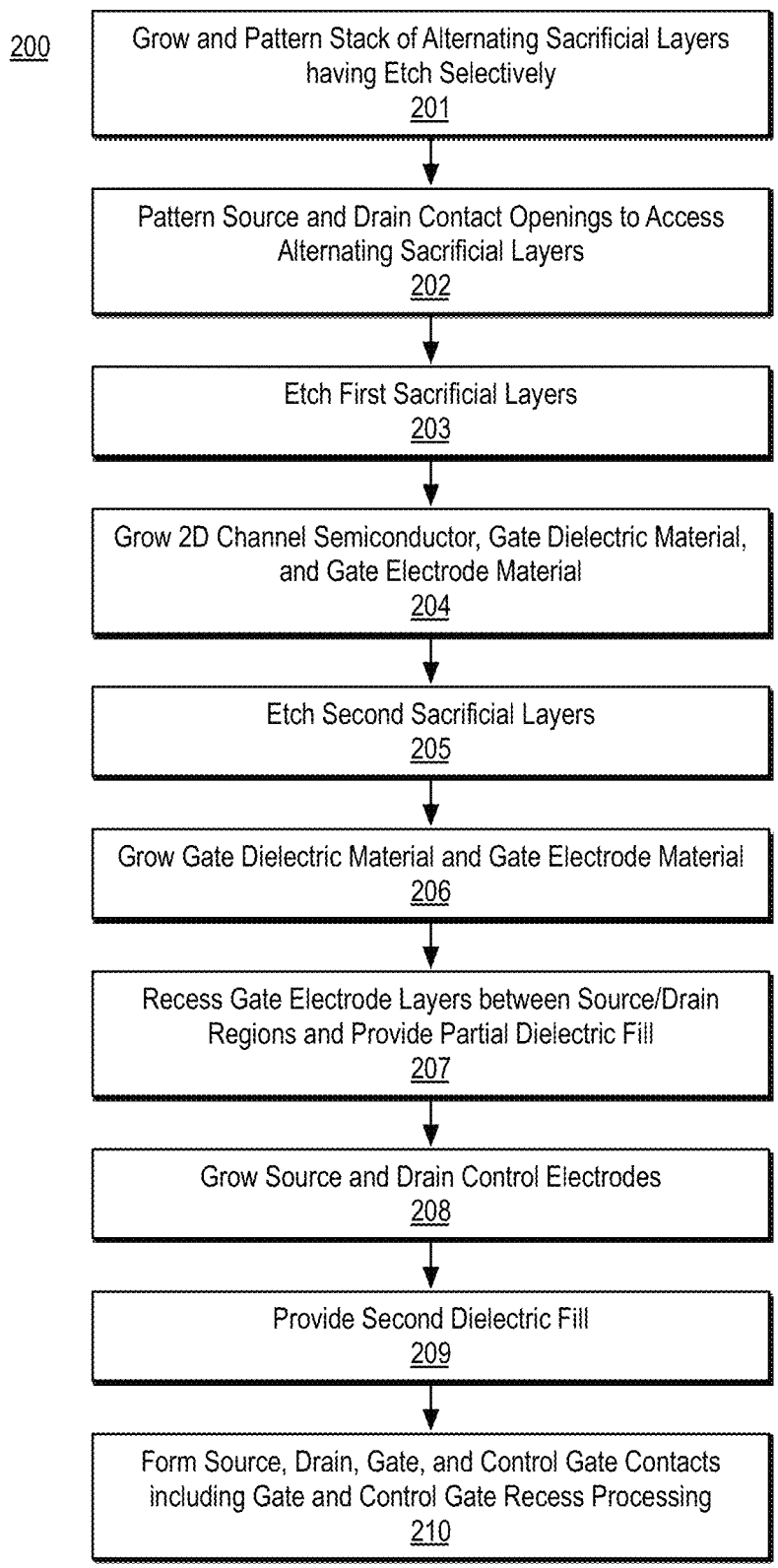
FIG. 2 illustrates a flow diagram illustrating an example process for fabricating transistor structures having source and drain control electrodes to control semiconductor material in source and drain regions.

FIG. 2 illustrates a flow diagram illustrating an example process 200 for fabricating transistor structures having source and drain control electrodes to control semiconductor material in source and drain regions, arranged in accordance with at least some implementations of the present disclosure. For example, process 200 may be implemented to fabricate transistor structure 100 or any other transistor structure discussed herein. In the illustrated embodiment, process 200 includes one or more operations as illustrated by operations 201-210. However, embodiments herein may include additional operations, certain operations being omitted, or operations being performed out of the order provided. In an embodiment, process 200 may fabricate transistor structure 1000 or a similar transistor structure having a differing material stack structure as discussed further herein with respect to FIGS. 13A, 13B, and 13C.

FIGS. 3A, 4A, 5A, 6A, 7A, 8A, 9A, 10A, 11A, 12A, 13A, 14A, and 15A illustrate top down views of example transistor structures, FIGS. 3B, 4B, 5B, 6B, 7B, 8B, 9B, 10B, 11B, 12B, 13B, 14B, and 15B illustrate cross-sectional side views of such transistor structures taken along the A-A' plane, and FIGS. 3C, 4C, 5C, 6C, 7C, 8C, 9C, 10C, 11C, 12C, 13C, 14C, and 15C illustrate cross-sectional side views of such transistor structures taken along the B-B' plane, as particular fabrication operations are performed to generate transistor structures having source and drain control electrodes to control semiconductor material in source and drain regions, arranged in accordance with at least some implementations of the present disclosure. In particular, reference will be made to FIGS. 3 to 15 in the context of process 200.

Process 200 begins at operation 201, where a stack of alternating sacrificial layers are grown and patterned over a substrate such that the alternating sacrificial layers have an etch selectivity therebetween. The stack of alternating sacrificial layers may be grown and patterned using any suitable technique or techniques. In some embodiments, a field insulator (e.g., field oxide) is bulk deposited and patterned over a substrate to form openings or exposed substrate regions such that the stack of alternating sacrificial layers are formed therein. Other techniques may be used. The stack of alternating sacrificial layers may include any materials that have an etch selectivity therebetween. In some embodiments, alternating dielectric layers having etch selectivity therebetween are deployed. In some embodiments, the first sacrificial layer is aluminum nitride and the second sacrificial layer is gallium nitride. In some embodiments, the first sacrificial layer is an oxide (e.g., a silicon oxide) and the second sacrificial layer is a nitride (e.g., a silicon nitride). Other materials systems may be used.

Figure 3A:
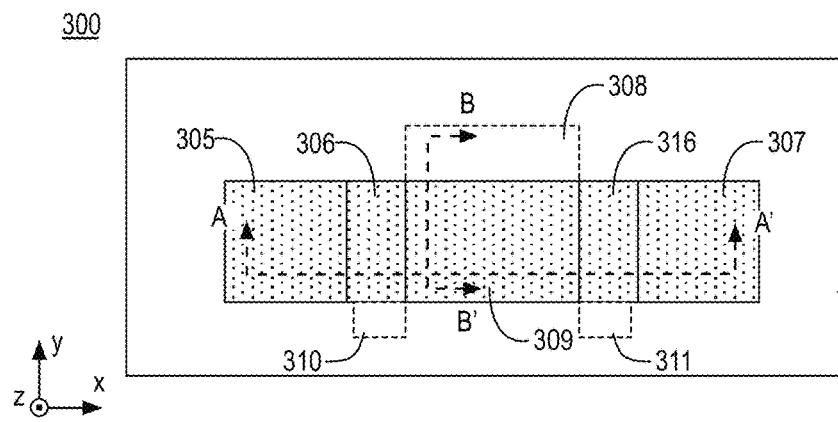
Figure 3B:
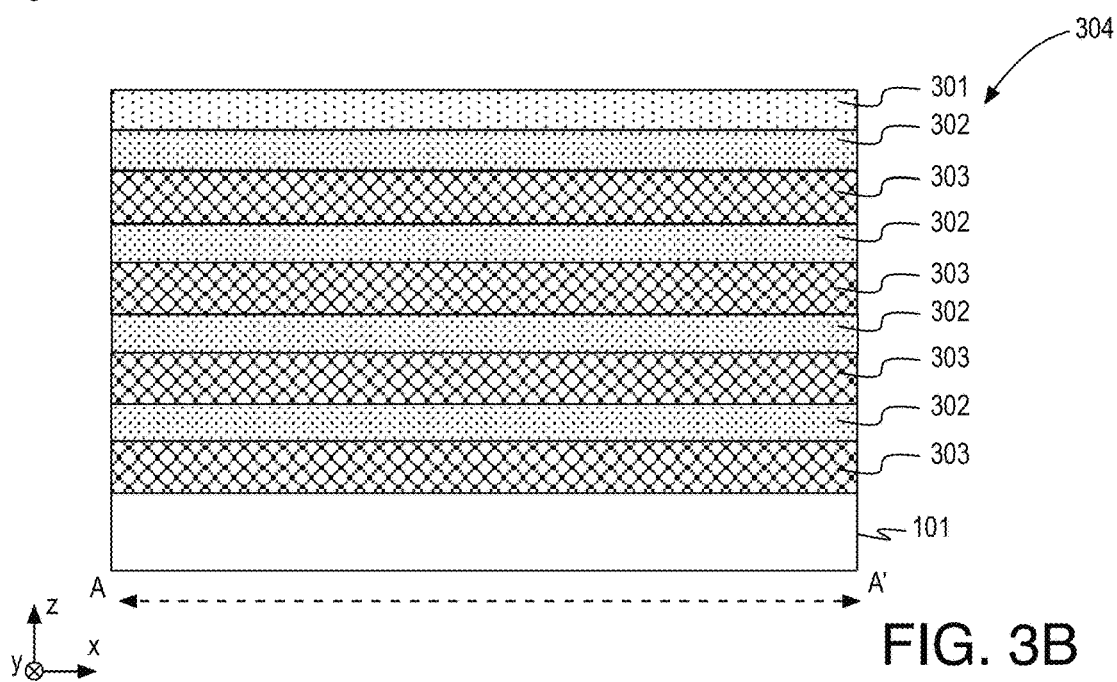
Figure 3C:
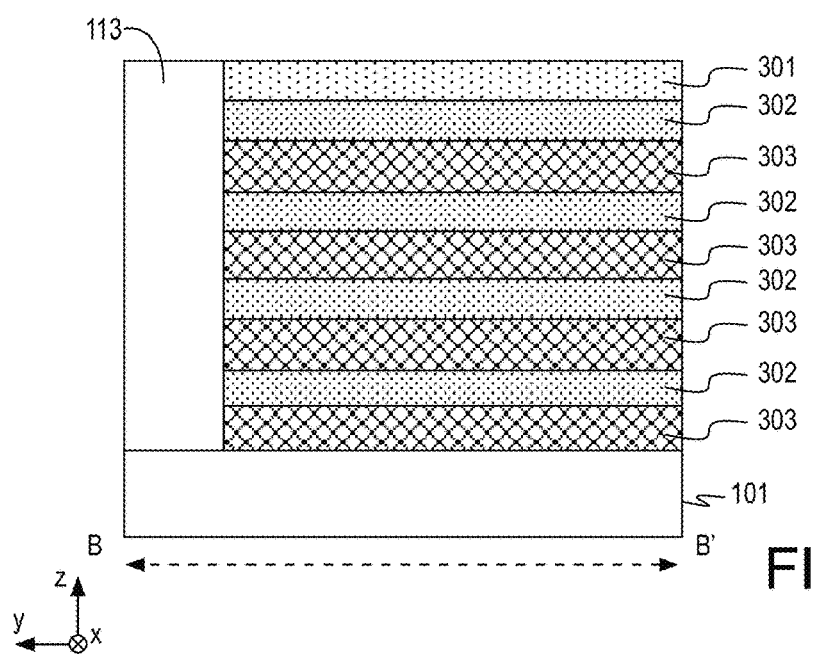

FIGS. 3A, 3B, and 3C illustrate an example received transistor structure 300, after the formation of an exemplary material stack 304 of alternating sacrificial layers 302, 303. As shown, material stack 304 includes alternating or interleaved layers of first sacrificial layers 302 (e.g., of a first material), and second sacrificial layers 303 (e.g., of a second material). Notably, alternating sacrificial layers 302, 303 have an etch selectivity therebetween. In some embodiments, sacrificial layers 302 include aluminum nitride and sacrificial layers 303 include gallium nitride (or vice versa). In some embodiments, sacrificial layers 302 include an oxide and sacrificial layers 303 include a nitride (or vice versa). Sacrificial layers 302, 303 may have any suitable thickness such as thicknesses in the range of about 10 to 30 nm. Sacrificial layers 302, 303 may have the same thicknesses or they may be different. Also as shown, material stack 304 is formed within an opening of a field insulator 113 such as a field oxide. Material stack 304 also includes a capping layer 301, which may include the same material as field insulator 113, a low-k dielectric, or other dielectric material. Such structures may be formed using any suitable technique or techniques. In some embodiments, field insulator 113 is bulk deposited and patterned using lithography techniques. Material stack 304 is then grown using known deposition techniques such as chemical vapor deposition (CVD). In some embodiments, an optional planarization operation is then deployed.

As shown with respect to FIG. 3A, regions of transistor structure 300 may be defined including a source contact region 305, a source control region 306, a source control gate contact region 310, a drain control gate contact region 311, a channel region 309, a gate contact region 308, a drain control region 316, and a drain contact region 307. Notably, such regions define the locations of eventual transistor components such that channel region 309 is to include interleaved semiconductor channel layers and gate layers, and source control region 306 and drain control region 316 include source control electrodes 106 and drain control electrodes 107, respectively to control such regions via eventual control gate contacts in source contact region 305 and drain contact region 307. Such regions may have any suitable lateral dimensions. In some embodiments, the x-dimension of channel region 309 is not more than 15 nm. In some embodiments, the x-dimension of channel region 309 is not more than 10 nm. In some embodiments, the y-dimension of channel region 309 is about that of the x-dimension thereof. Source contact region 305, drain contact region 307, and gate contact region 308 may have the same or similar dimensions with contact region 308 having a reduced y-dimension. Source and drain control regions 306, 316 may have x-dimensions of about one-fourth to one-third of that of channel region 309. Other components sizes may be implemented. In subsequent FIGS. 4 to 15, such regions are not labeled for the sake of clarity and instead the pertinent material of such regions in the top down view are labeled.

Returning to FIG. 2, processing continues at operation 202, where source and drain contact openings are patterned to expose or access the stack of alternating sacrificial layers formed at operation 201. Notably, the stack of alternating sacrificial layers are exposed at sidewalls thereof and also include sidewalls that are not exposed or accessed. For example, windows that will later be used for contact plug fill (e.g., source and drain contact plugs) may be patterned and anisotropically dry etched down to the substrate for following selective etch of ones of the alternating sacrificial layers. The materials of the source and drain contact regions may be removed using any suitable technique or techniques such as lithography and anisotropic etch techniques.

Figure 4A:
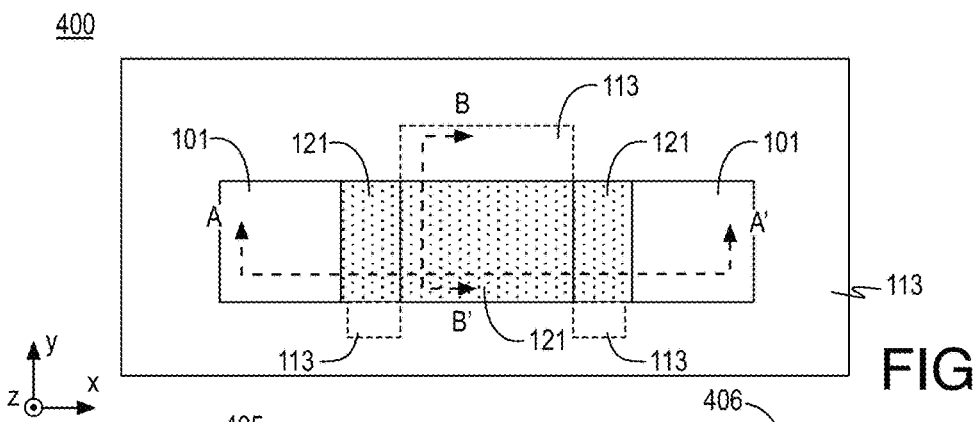
Figure 4B:
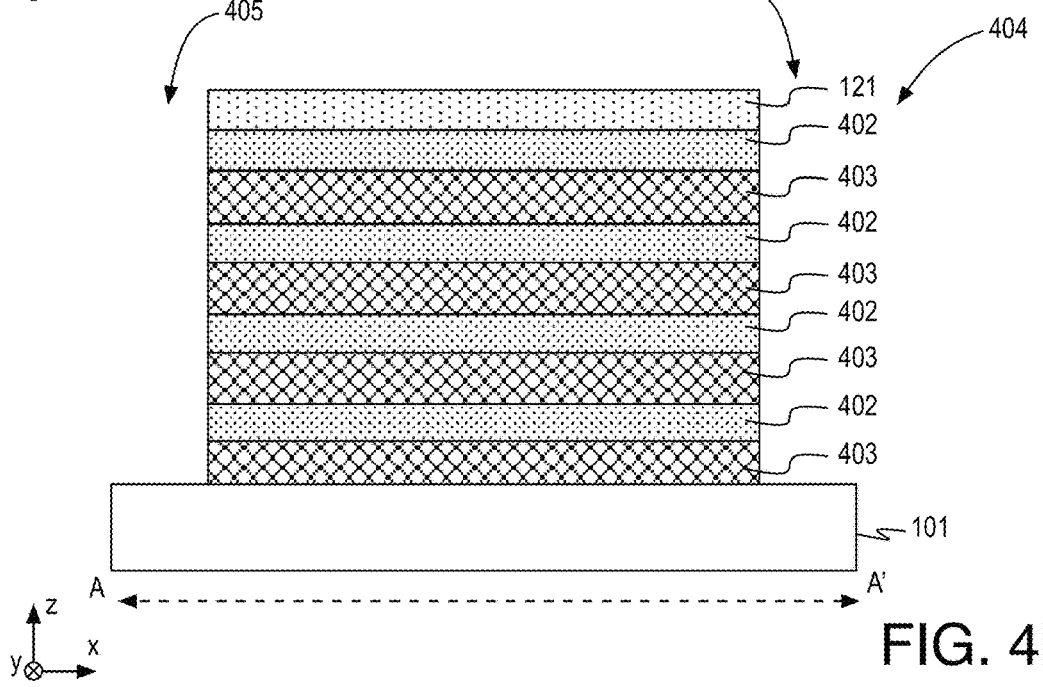
Figure 4C:
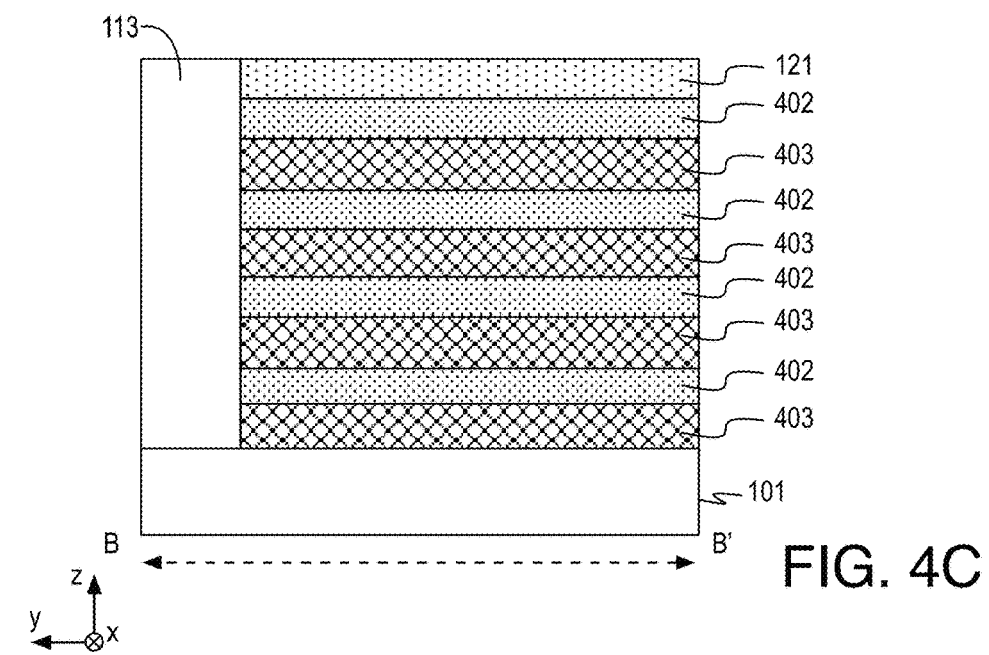

FIGS. 4A, 4B, and 4C illustrate an example transistor structure 400 similar to transistor structure 300, after patterning to remove materials from source contact region 305 and drain contact region 307 to form openings 405, 406 and to form a material stack 404 inclusive of alternating patterned sacrificial layers 402, 403, which have characteristics similar to those of sacrificial layers 302, 303. As discussed, such patterning may be performed using any suitable technique or techniques such as lithography and anisotropic etch techniques.

Returning to FIG. 2, processing continues at operation 203, where one set of the alternating sacrificial layers formed at operation 201 are selectively etched. Such selective etch may be performed using any suitable technique or techniques such as selective isotropic wet etch techniques. The remaining other set of the alternating sacrificial layers are anchored against the field dielectric and provide openings and surfaces for the growth of channel semiconductor material layers, gate dielectric layers, and gate electrode layers as discussed below.

Figure 5A:
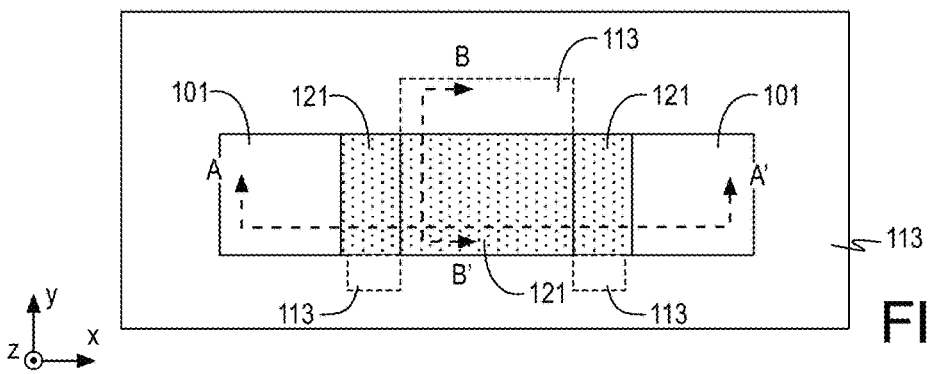
Figure 5B:
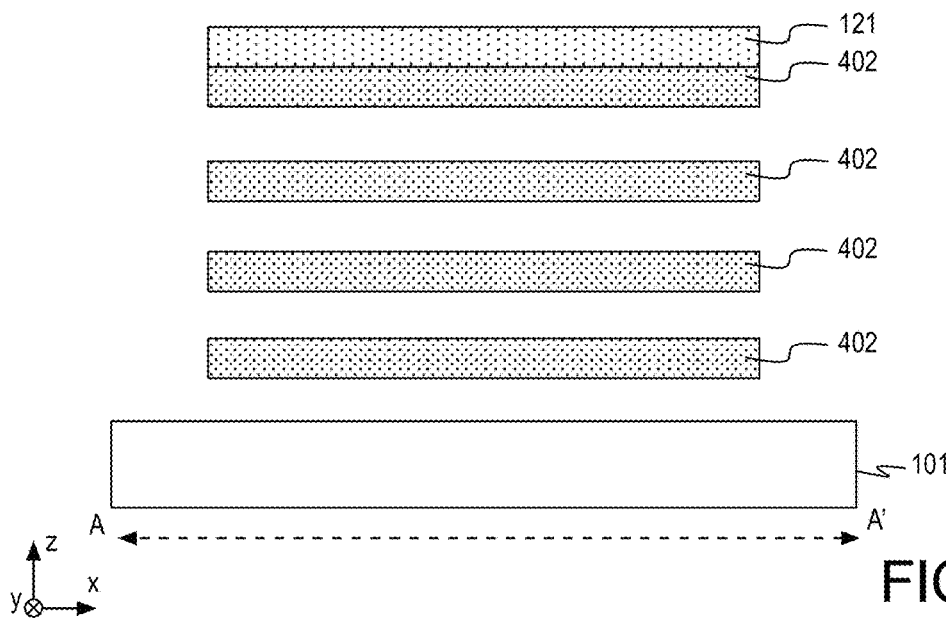
Figure 5C:
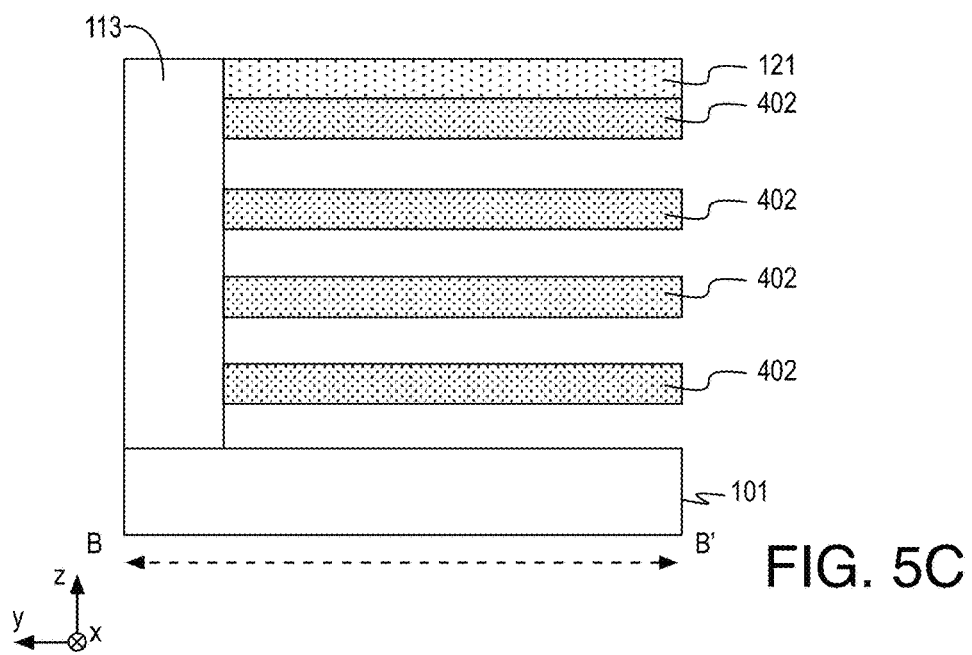

FIGS. 5A, 5B, and 5C illustrate an example transistor structure 500 similar to transistor structure 400, after removal of patterned sacrificial layers 403, leaving patterned sacrificial layers 402. Notably, surfaces of patterned sacrificial layers 402 provide surfaces for the growth of channel semiconductor material layers inclusive of 2D materials. Such patterned sacrificial layers 403 may be removed using any suitable technique or techniques such as highly selective wet etch techniques that remove patterned sacrificial layers 403 while leaving all or substantial portions of patterned sacrificial layers 402.

Returning to FIG. 2, processing continues at operation 204, where 2D channel semiconductor material is grown selectively on the exposed surfaces of the remaining sacrificial layers, gate dielectric layers are grown selectively on the channel semiconductor material layers, and gate electrode layers are grown selectively on the gate dielectric layers to fill between the gate dielectric layers. Such depositions may be performed using any suitable technique or techniques. In some embodiments, the 2D channel semiconductor material is formed by a CVD or metal organic chemical vapor deposition (MOCVD) process. In some embodiments, the 2D channel semiconductor material is formed by an atomic layer deposition (ALD) process. Depending on processing embodiments, the chemical synthesis may use a solid or a gaseous precursor. In one embodiment, a CVD process utilizes a solid precursor such as a transition metal oxide and a pure chalcogen in a CVD furnace or similar processing chamber. In MOCVD embodiments, chemical synthesis may use gaseous precursors. The 2D channel semiconductor material may include one or more monolayers formed using such techniques and may have any thicknesses discussed herein such as thicknesses of not more than 2 nm or not more than 1 nm. The gate dielectric layers are then formed using any suitable technique or techniques such as deposition techniques inclusive of CVD. Similarly, the gate electrode layers are then formed using any suitable technique or techniques such as deposition techniques.

Figure 6A:
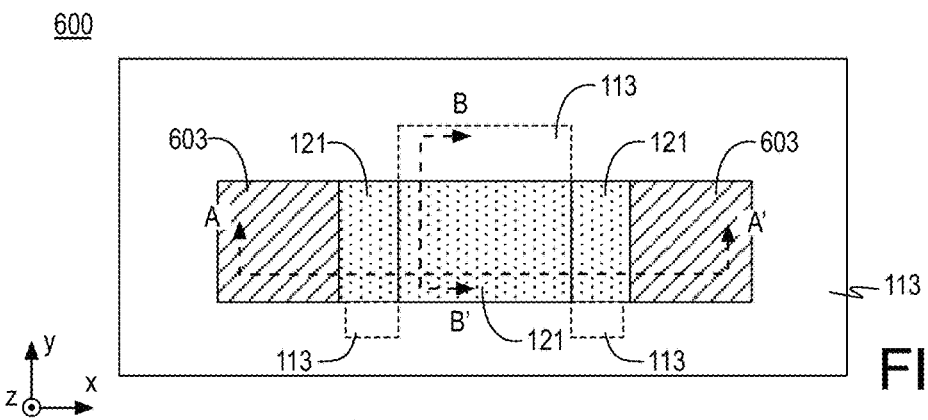
Figure 6B:
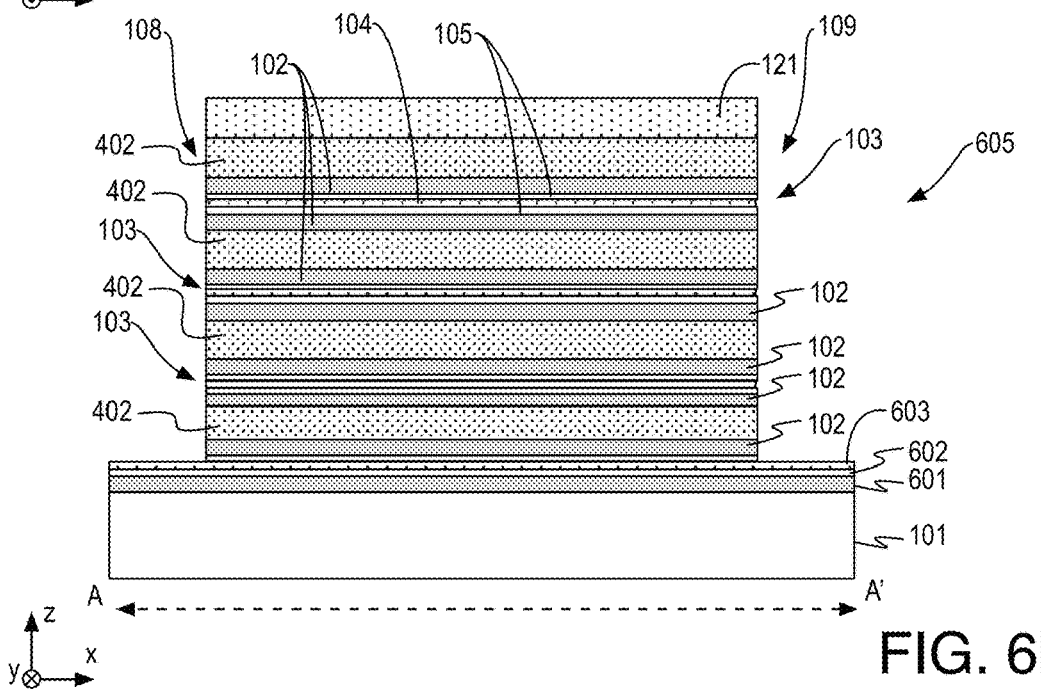
Figure 6C:
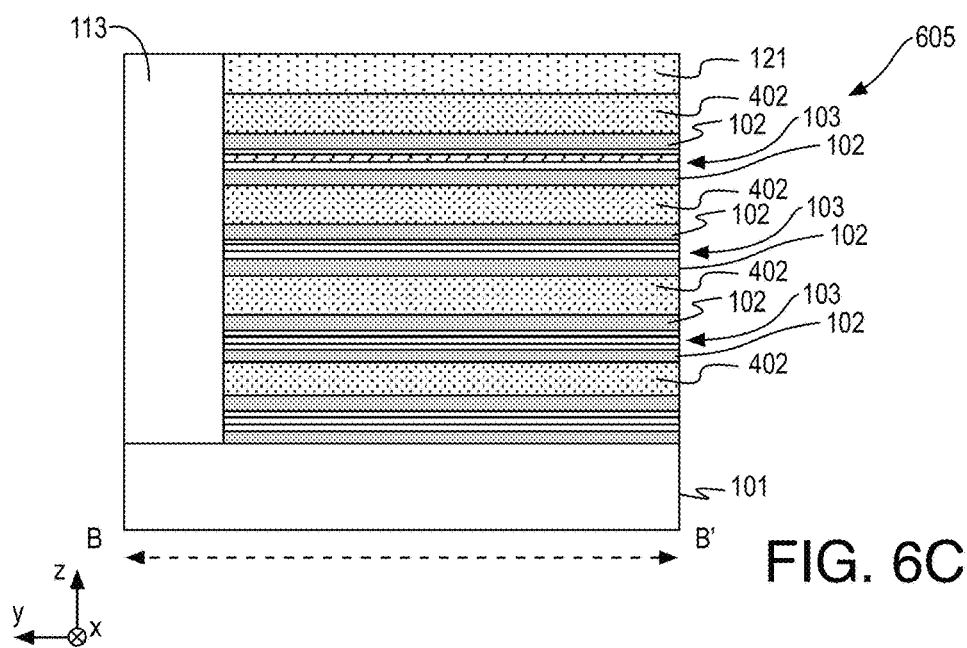

FIGS. 6A, 6B, and 6C illustrate an example transistor structure 600 similar to transistor structure 600, after deposition of 2D channel semiconductor layers, gate dielectric layers, and gate electrode layers to form a material stack 605. As shown, semiconductor channel layers 102 are formed on exposed horizontal surfaces of patterned sacrificial layers 402 using techniques discussed with respect to operation 204. Semiconductor channel layers 102 may have any characteristics discussed with respect to FIGS. 1A, 1B, and 1C or elsewhere herein.

After deposition of semiconductor channel layers 102, dielectric layers 105 layers are deposited. Subsequently, gate electrode layers 104 are formed. Notably, formed gate layers 103 each include one of gate electrode layers 104 sandwiched between two of dielectric layers 105 such that dielectric layers 105 are each on adjacent ones of semiconductor channel layers 102. That is, each space between adjacent patterned sacrificial layers 402 are filled with 2D semiconductor, gate dielectric material (e.g., high-k gate dielectric), and gate electrode material (e.g., a metal gate). Also as shown, a semiconductor channel layer 601, a gate dielectric layer 602, and a gate electrode layer 603 may be formed on substrate 101. Such layers may be inoperable portions of the transistor structure or they may later be patterned and incorporated into the device.

Returning to FIG. 2, processing continues at operation 205, where the second set of the alternating sacrificial layers formed at operation 201 are selectively etched. That is, the set not etched at operation 203 are selectively etched. Such selective etch may be performed using any suitable technique or techniques such as selective isotropic wet etch techniques.

Figure 7A:
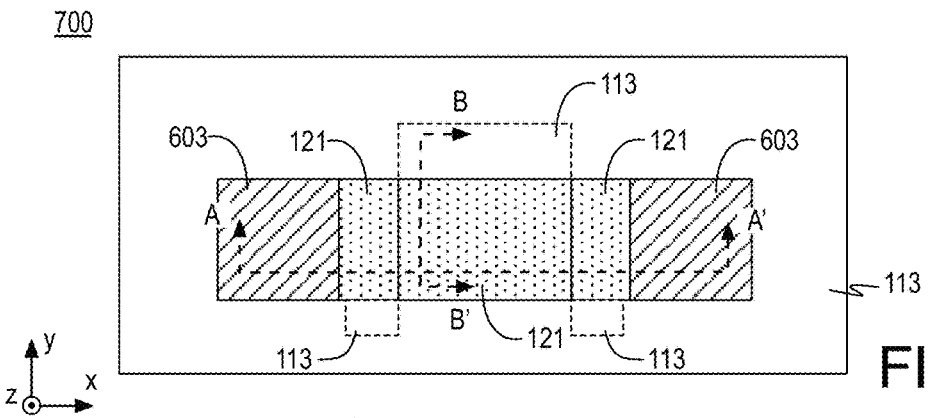
Figure 7B:
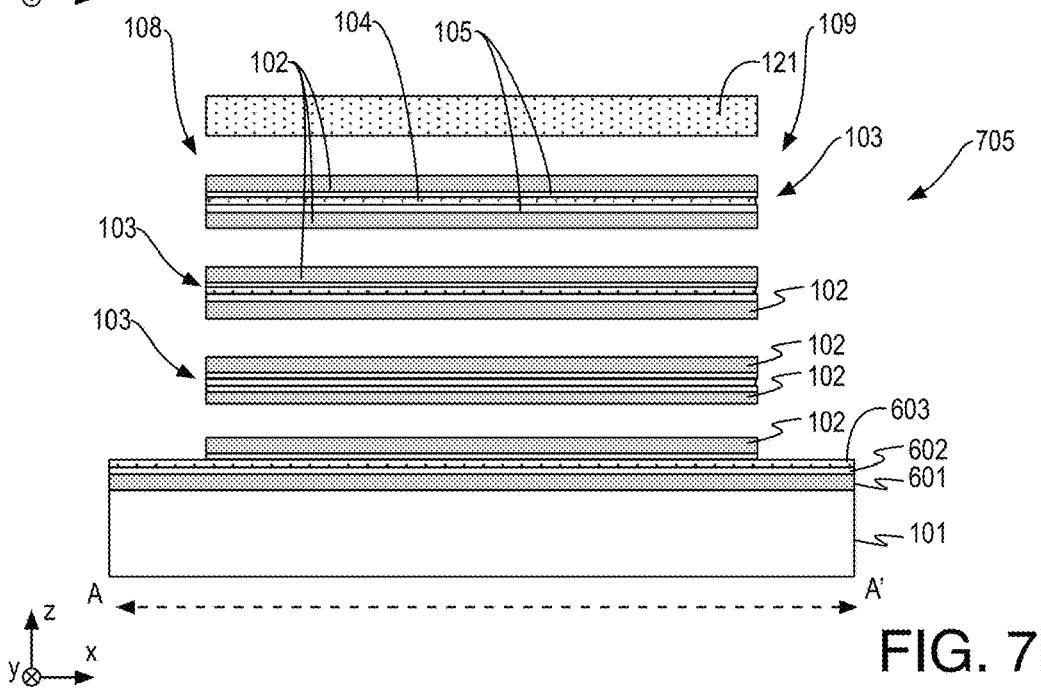
Figure 7C:
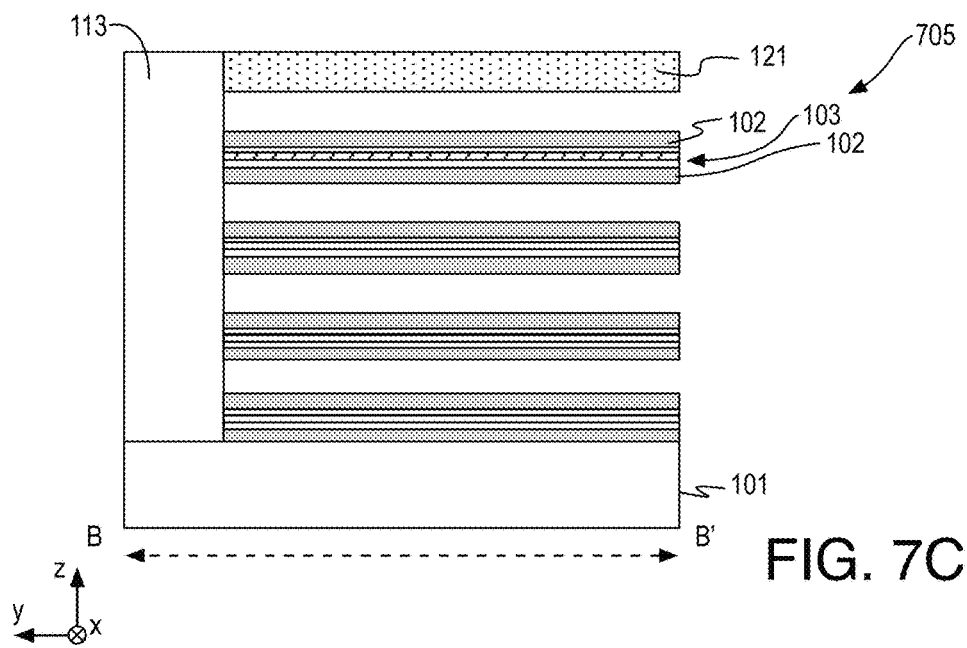

FIGS. 7A, 7B, and 7C illustrate an example transistor structure 700 similar to transistor structure 600, after removal of patterned sacrificial layers 402, leaving semiconductor channel layers 102, dielectric layers 105 layers, and gate electrode layers 104. Such selective etching exposes one surface of each of semiconductor channel layers 102 with the other surface being covered by one of dielectric layers 105. For example, material stack 705 includes groupings of a single gate electrode layer 104 sandwiched between two dielectric layers 105, which are further sandwiched between two semiconductor channel layers 102 while the outside surfaces of the pair of semiconductor channel layers 102 are exposed.

Returning to FIG. 2, processing continues at operation 206, where gate dielectric layers are grown on the exposed surfaces of the channel semiconductor material layers and gate electrode layers (or fill) are grown selectively on the gate dielectric layers. Such depositions may be performed using any suitable technique or techniques. In some embodiments, the gate dielectric layers and gate electrode layers are formed using CVD techniques. In some embodiments, the gate dielectric layers and gate electrode layers are formed using ALD techniques.

Figure 8A:
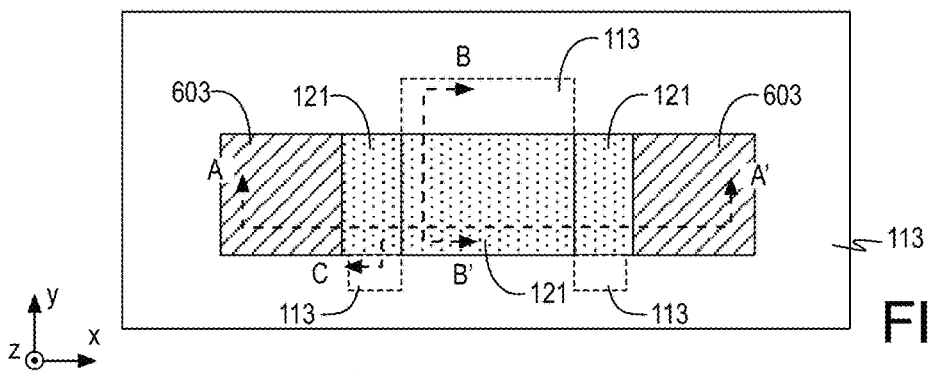
Figure 8B:
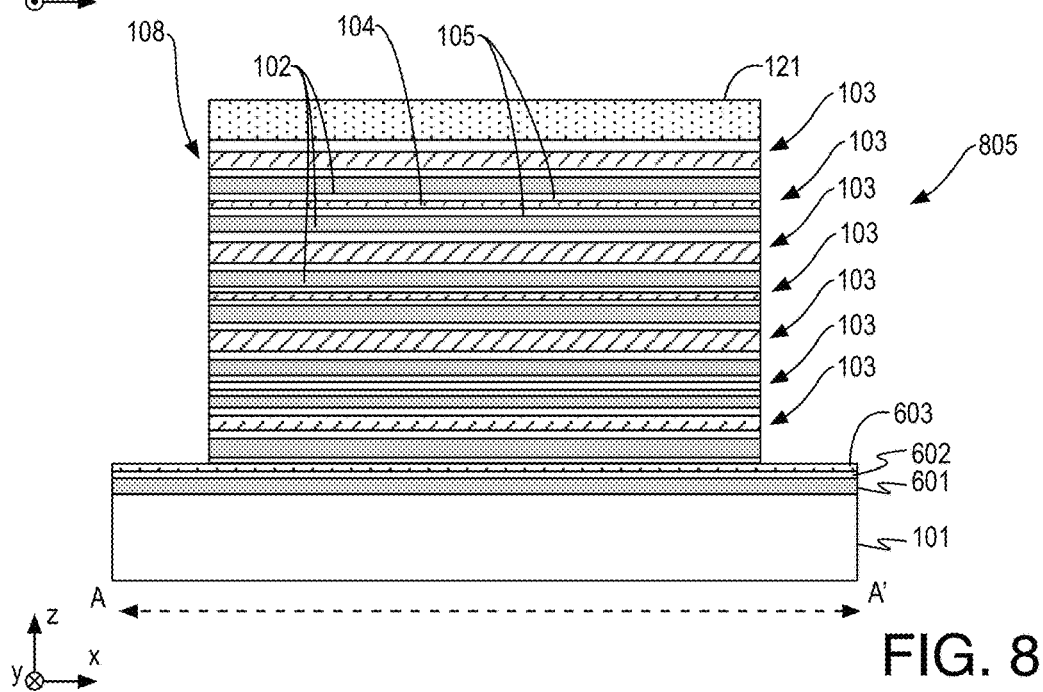
Figure 8C:
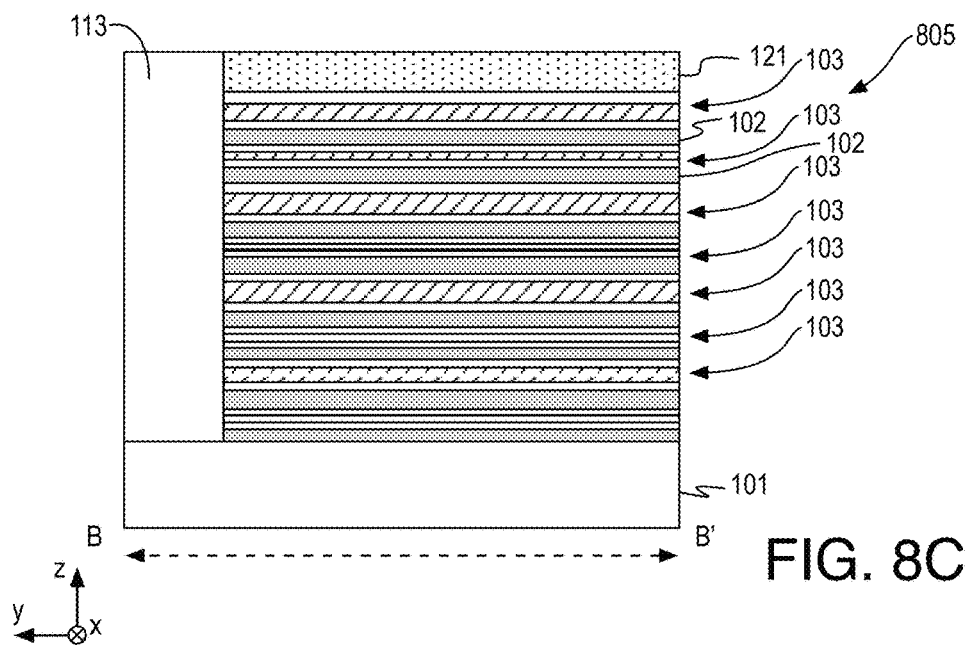

FIGS. 8A, 8B, and 8C illustrate an example transistor structure 800 similar to transistor structure 700, after deposition of gate dielectric layers on the exposed channel semiconductor material layers and gate electrode layers within openings between the gate dielectric layers to form a material stack 805. As shown, the remainder of gate layers 103 are formed by first depositing the remainder of dielectric layers 105 on exposed surfaces of semiconductor channel layers 102. Subsequently, gate electrode layers 104 are formed. As shown, each of gate layers 103 includes one of gate electrode layers 104 sandwiched between two of dielectric layers 105 such that dielectric layers 105 are each on adjacent ones of semiconductor channel layers 102. Thereby, the interleaved layers of semiconductor channel layers 102, dielectric layers 105, and gate electrode layers 104 are formed such that semiconductor channel layers 102 may be controlled by gate electrode layers 104. Notably, the interleaved structure advantageously provides a number of semiconductor channel layers 102 that are controlled by closely adjacent gate electrode layers 104.

As shown, a second selective isotropic etch (as discussed with respect to operation 205 and FIGS. 7A, 7B, and 7C) is employed to etch out patterned sacrificial layers 402 substantially without affecting the previously formed semiconductor channel layers 102, dielectric layers 105, and gate electrode layers 104. The exposed regions are subsequently filled in with dielectric layers 105 (e.g., high-k dielectric) and gate electrode layers 104 (e.g., a metal gate material).

Returning to FIG. 2, processing continues at operation 207, where the exposed gate electrode layers are recessed in the source and drain regions and the recesses are partially filled with a dielectric material. Such recessing may be performed using any suitable technique or techniques such as a timed selective etch process to etch the gate metal material selectively to other materials in the stack. For example, the gate metal is then recessed to leave a lateral length of a desired channel length. The partial dielectric fill may then be provided using any suitable technique or techniques such as selective growth techniques or growth and patterning techniques or the like. Notably, the partial dielectric fill provides, for example, a low-k dielectric fill to electrically insulate gate electrodes from subsequent source and drain control electrodes.

Figure 9A:
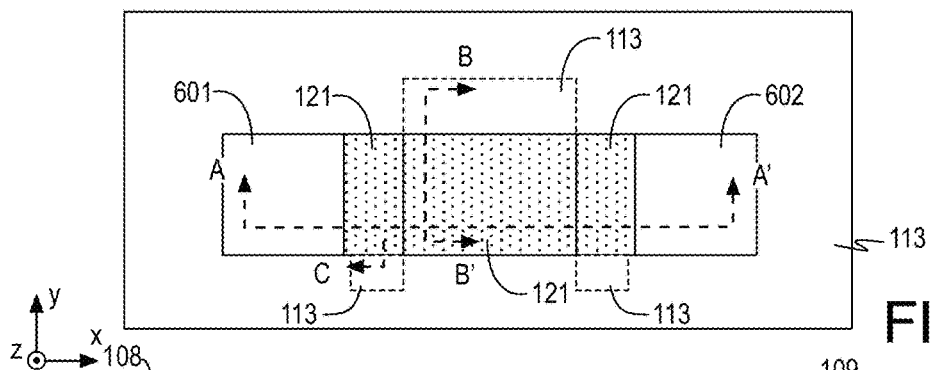
Figure 9B:
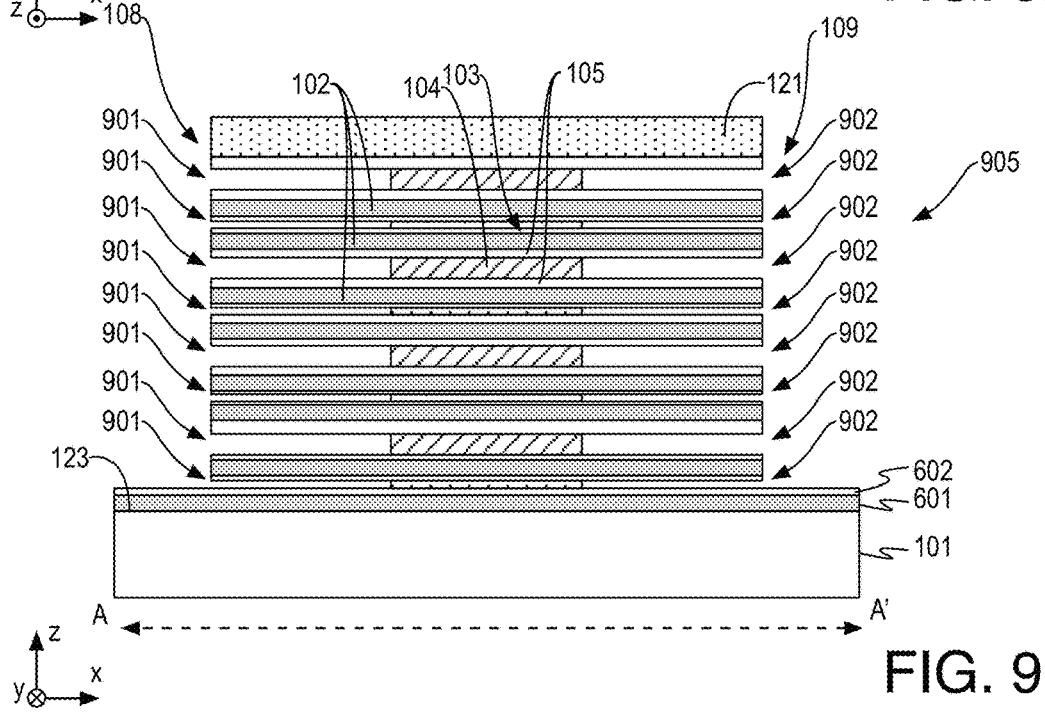
Figure 9C:
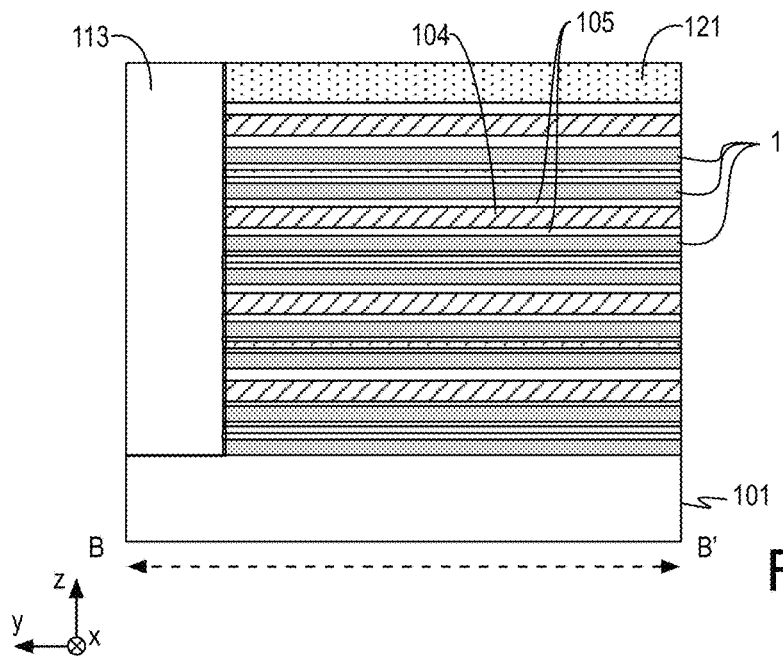

FIGS. 9A, 9B, and 9C illustrate an example transistor structure 900 similar to transistor structure 800, after recessing gate electrode layers 104 to provide recesses 901, 902 on each of opposite lateral ends 108, 109 of material stack 905, respectively. For example, recesses 901, 902 may be formed using timed selective etch techniques. As shown, recesses 901, 902 are at opposite lateral ends 108, 109 of gate electrode layers 104 (e.g., they are directly lateral to gate electrode layers 104). Furthermore, recesses 901, 902 are between adjacent ones of dielectric layers 105 such that dielectric layers 105 are on opposite surfaces (e.g., surfaces in the x-y plane) of the pertinent gate electrode layer 104 and dielectric layers 105 extend beyond an edge of the pertinent gate electrode layer 104 to encompass each recess. Recesses 901, 902 may have any suitable lateral dimension (i.e., in the x-dimension) such as a dimension substantially the same as the length (i.e., in the x-dimension and along a channel length) of gate electrode layers 104. In some embodiments, recesses 901, 902 are each be about 15 nm. In some embodiments, recesses 901, 902 are each be about 10 nm. Other dimensions may be used. Such recessing provides a location for the subsequent growth of dielectric fills and source and drain control electrodes as discussed further herein below.

Figure 10A:
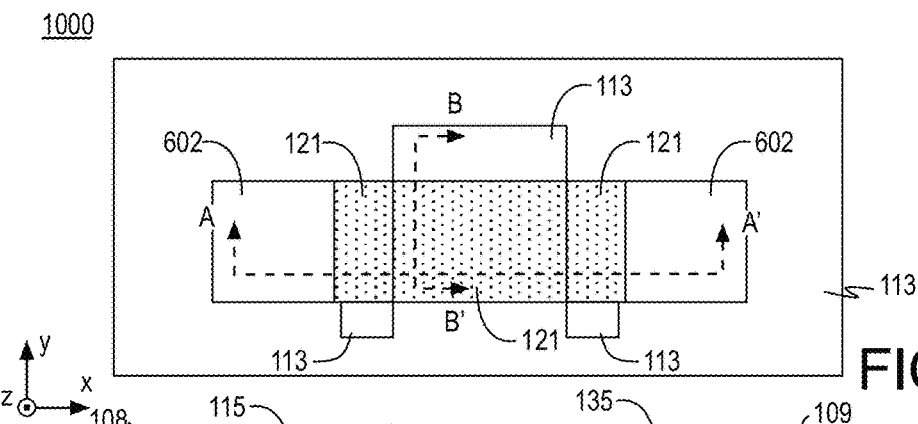
Figure 10B:
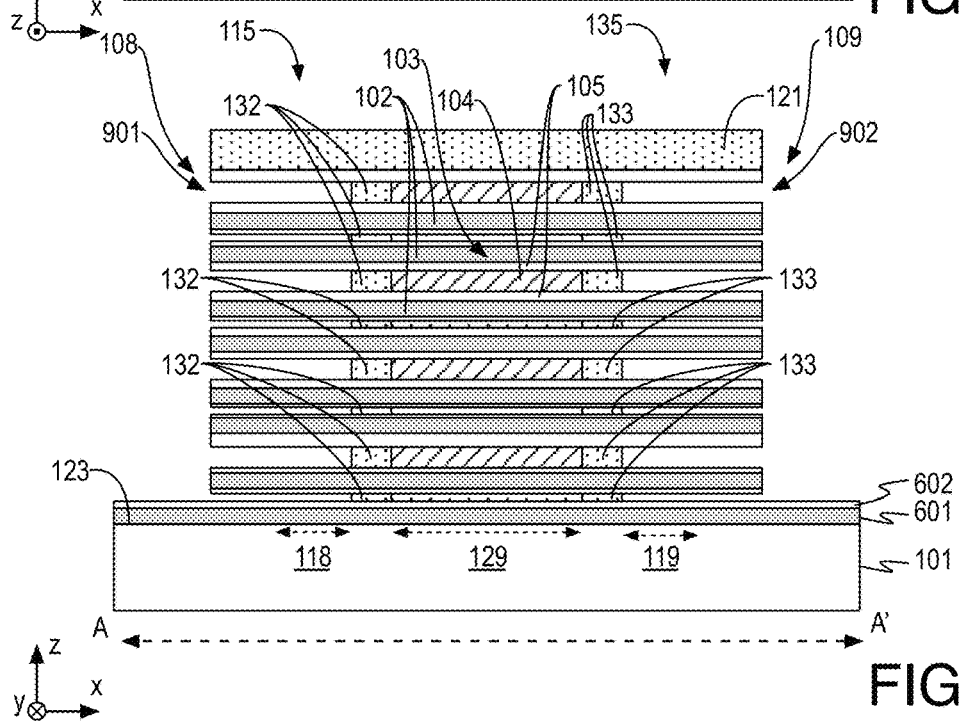
Figure 10C:
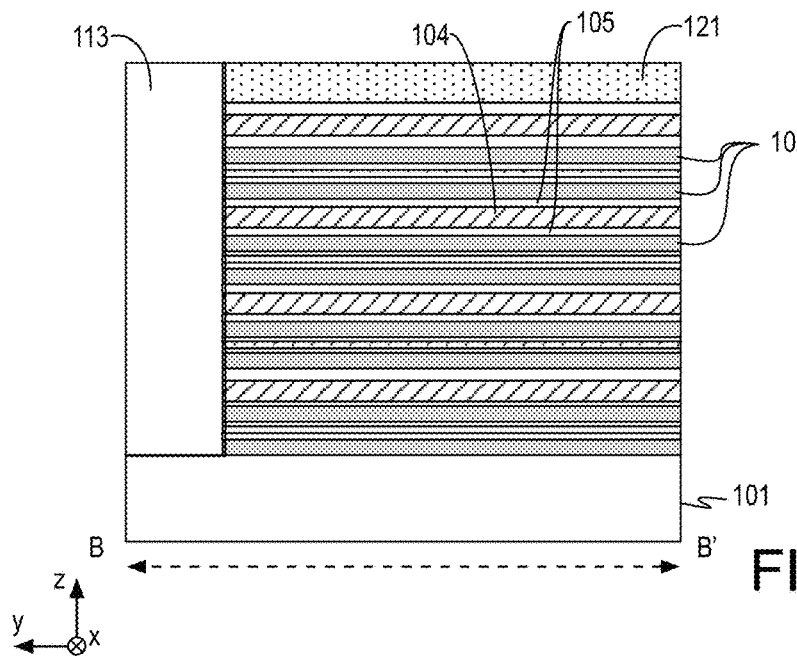

FIGS. 10A, 10B, and 10C illustrate an example transistor structure 1000 similar to transistor structure 900, after partially filling each of recesses 901, 902 with dielectric fills or plugs 132, 133, respectively. For example, each of recesses 901, 902 are partially filled with dielectric fills or plugs 132, 133, respectively. Dielectric fills or plugs 132, 133 are formed using any suitable technique or techniques such as selective growth techniques. Dielectric fills or plugs 132, 133 may include any dielectric material such as a low-k dielectric material such as silicon oxide or nitride. For example, dielectric fills or plugs 132, 133 and capping layer 121 may have a lower dielectric constant than dielectric layers 105. Dielectric fills or plugs 132, 133 may laterally fill any suitable portion (e.g., in the x-dimension) of recesses 901, 902 such as about one-fourth of recesses 901, 902.

Returning to FIG. 2, processing continues at operation 208, where the source and drain control electrodes are grown within another portion of the exposed recesses. The partial fill of the recesses the source and drain control electrodes may be performed using any suitable technique or techniques such as metal deposition techniques, CVD, ALD, or the like. In some embodiments, the source and drain control electrodes are formed of the same material as that of the gate electrode layers. However, other materials such as metals may be deployed.

Figure 11A:
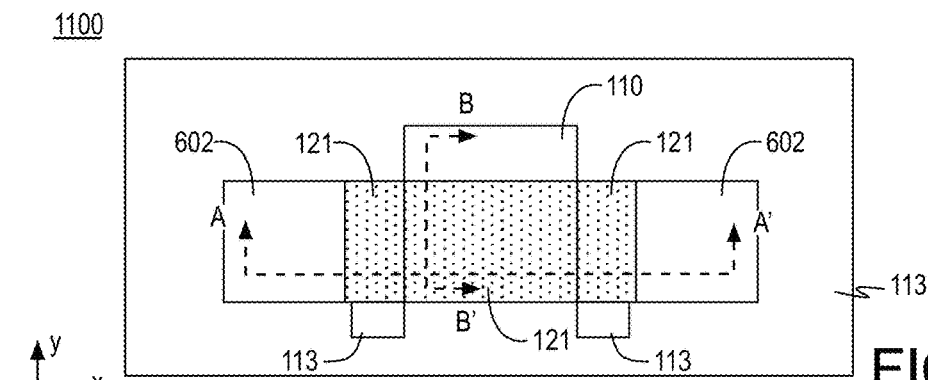
Figure 11B:
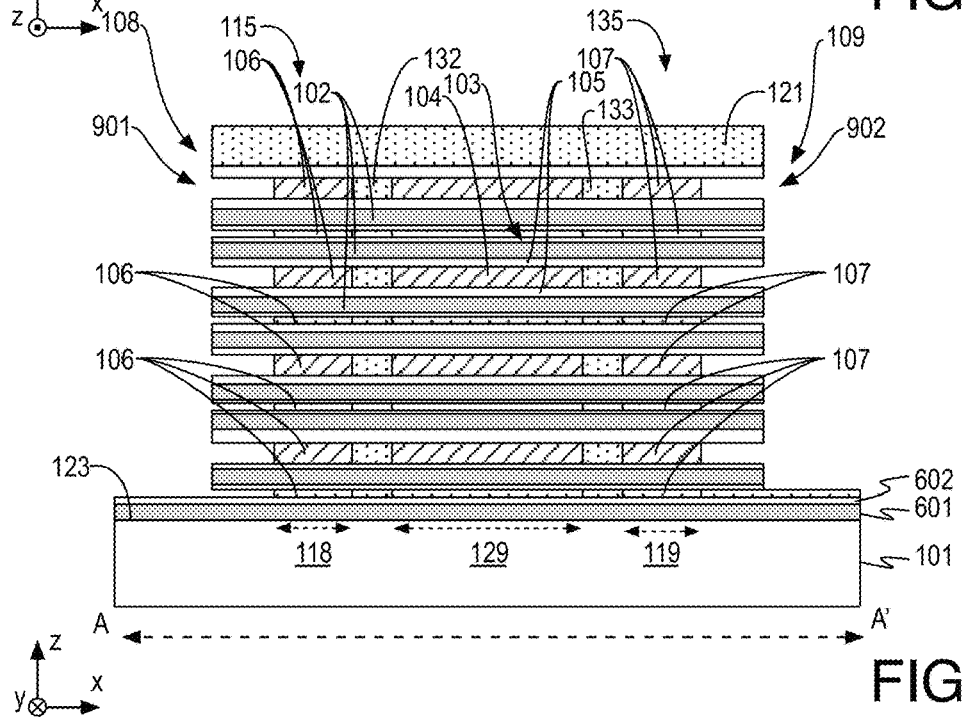
Figure 11C:
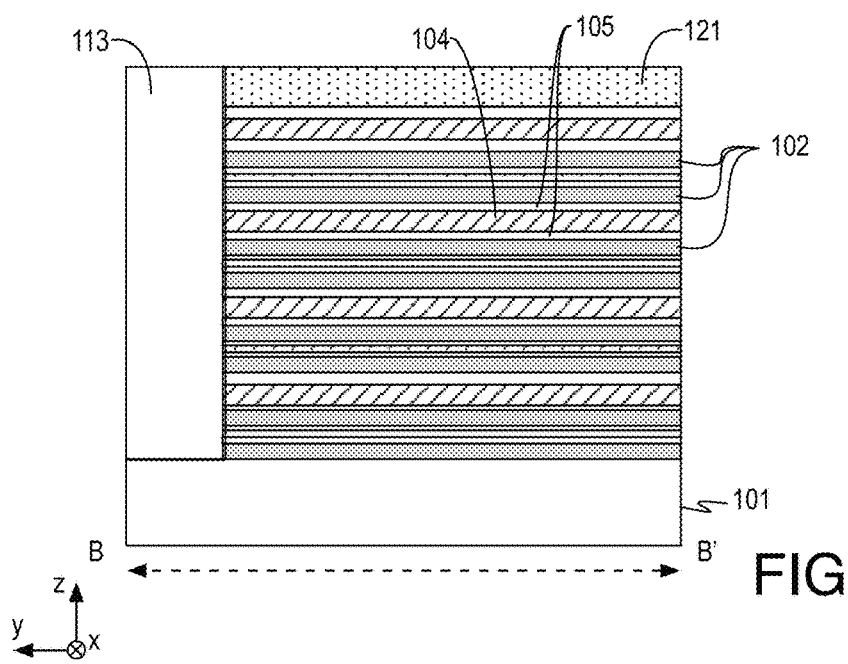

FIGS. 11A, 11B, and 11C illustrate an example transistor structure 1100 similar to transistor structure 1000, after partially filling each of recesses 901, 902 with source control electrodes 106 and drain control electrodes 107, respectively. Source control electrodes 106 and drain control electrodes 107 are formed using any suitable technique or techniques such as selective metal deposition techniques inclusive of ALD, CVD, and MOCVD. Source control electrodes 106 and drain control electrodes 107 may include materials discussed herein such as the same material as gate electrode layers 104 or another suitable control gate material such as a metal. Source control electrodes 106 and drain control electrodes 107 may each laterally fill any suitable portion (e.g., in the x-dimension) of recesses 901, 902 such as about one-half of recesses 901, 902.

Returning to FIG. 2, processing continues at operation 209, where the remaining regions of recesses are filled with a dielectric material, which may be the same or differing material with respect to that applied at operation 207. Such recessing may be performed using any suitable technique or techniques such as selective growth techniques or growth and patterning techniques or the like. Notably, the partial dielectric fill provides, for example, a low-k dielectric fill to electrically insulate source and drain control electrodes from subsequent source and drain contacts.

Figure 12A:
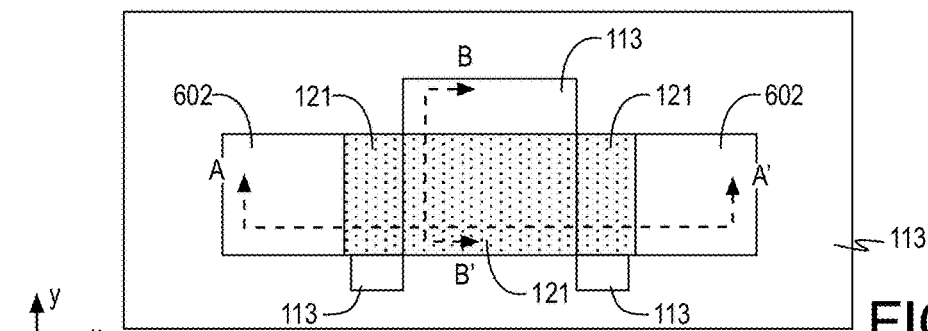
Figure 12B:
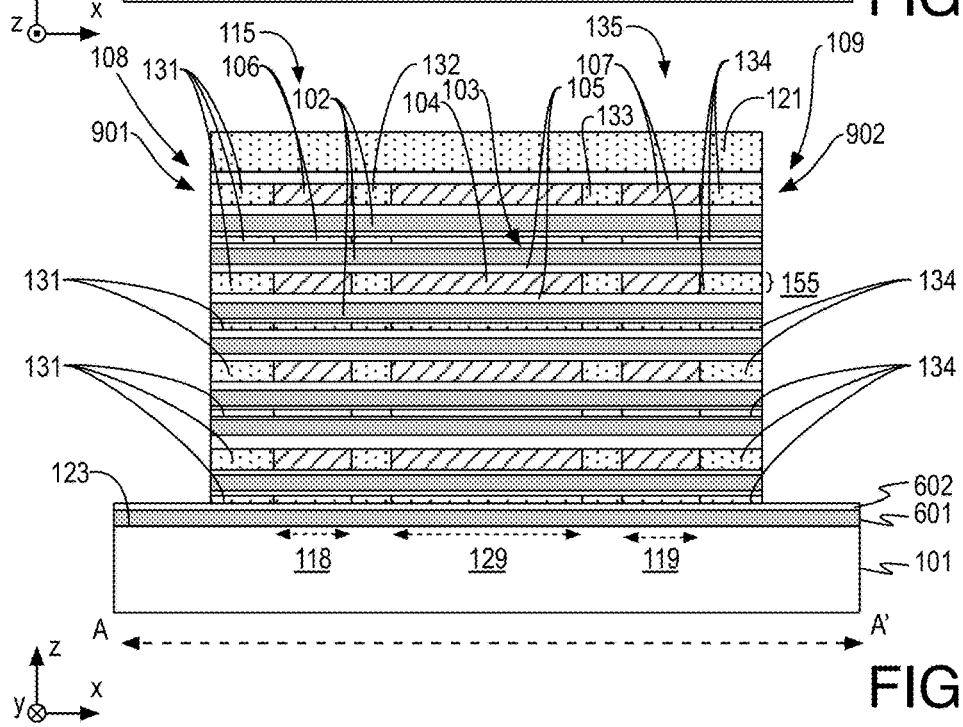
Figure 12C:
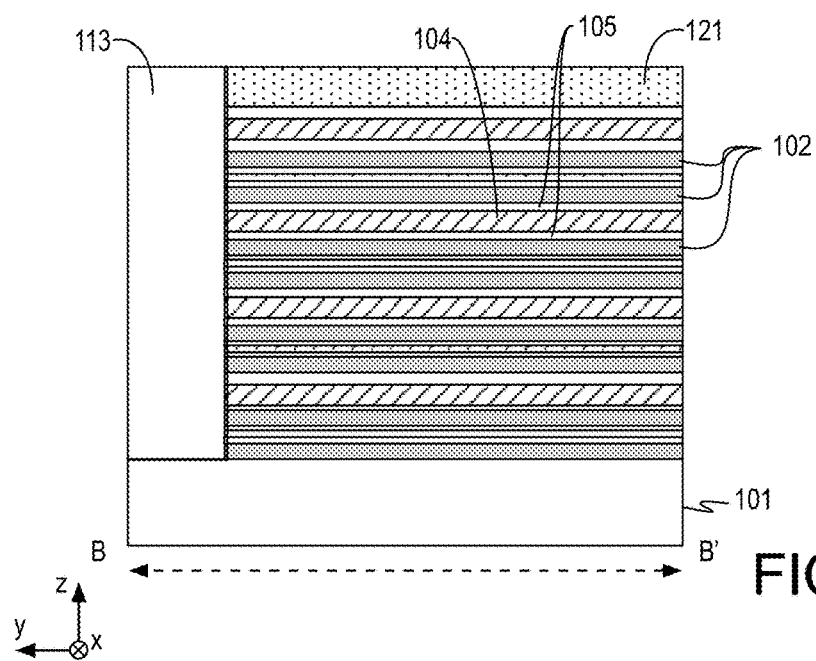

FIGS. 12A, 12B, and 12C illustrate an example transistor structure 1200 similar to transistor structure 1100, after filling the remainder of each of recesses 901, 902 with dielectric fills or plugs 131, 134, respectively. For example, the remaining opening of each of recesses 901, 902 are filled with dielectric fills or plugs 131, 134. Dielectric fills or plugs 131, 134 are formed using any suitable technique or techniques such as selective growth techniques. Dielectric fills or plugs 131, 134 may include any dielectric material such as a low-k dielectric material inclusive of silicon oxide or nitride. For example, dielectric fills or plugs 131, 134 and capping layer 121 may have a lower dielectric constant than dielectric layers 105. Dielectric fills or plugs 131, 134 may laterally fill the remaining portion (e.g., in the x-dimension) of recesses 901, 902 such as about one-fourth of recesses 901, 902.

Returning to FIG. 2, processing continues at operation 210, where the source, drain, gate, and control gate contacts are formed to contact source side 2D channel material, drain side 2D channel material, gate electrode layers, and source and drain control electrodes, respectively. Such processing may open a gate contact region and control gate contact regions, recess the 2D semiconductor channel layers, fill the recesses, and provide gate contact metal to contact the gate electrode layers and control gate contact metal to contact the source and drain control electrodes, both without shorting to the 2D semiconductor channel layers. Such processing may be performed with source and drain regions open (as illustrated herein) or with such source and drain regions filled with source and drain metal. In examples where the processing is performed with source and drain regions open, the subsequent source, drain, gate, and control gate metals may be the same (as illustrated herein). In examples where the source and drain metals are previously filled, the source and drain contacts may be different materials than the gate and control gate contacts.

In some embodiments, a timed selective etch process is deployed to etch back the 2D semiconductor channel layers selectively such that other materials in the stack are not substantially etched. The dielectric fill may then be provided using any suitable technique or techniques such as selective growth techniques or growth and patterning techniques or the like. In some embodiments, the dielectric fill is grown selectively on the exposed gate dielectric layers. After the etch back and dielectric provides electric insulation, the gate contact and control gate contacts are provided to contact the gate electrode layers and source and drain control electrodes, respectively, with the 2D semiconductor channel layers insulated from potential shorts.

FIGS. 13A, 13B, and 13C illustrate an example transistor structure 1300 similar to transistor structure 1200, after patterning to expose gate region 308, source control gate contact region 310, and drain control gate contact region 311 (please refer to FIG. 3A). Such processing may be performed using any suitable technique or techniques such as lithography and anisotropic etch techniques. As discussed, in some embodiments, source and drain contact regions 305, 307 may already be filled with contact metal during such processing to provide a more planar surface. As shown, exposing gate contact region 308 exposes a sidewall 1305 having exposed portions of gate electrode layers 104, dielectric layers 105, and semiconductor channel layers 102 with desired gate connection being only to gate electrode layers 104. Similarly, exposing source control gate contact region 310 exposes source control electrodes 106, dielectric layers 105, and semiconductor channel layers 102 with desired control gate connection being only to source control electrodes 106. In the same manner, exposing drain control gate contact region 311 exposes drain control electrodes 107, dielectric layers 105, and semiconductor channel layers 102 with desired control gate connection being only to source control electrodes 106.

As shown in FIGS. 13A, 13B, and 13C, semiconductor channel layers 102 are recessed to provide recesses 125 on a lateral end 1308 of material stack 1311 adjacent the gate region (e.g., the region where gate contact metal is to land).

In the same manner, recesses 125 are formed at sidewalls 1312, 1313 as exposed adjacent source control gate contact region 310 and drain control gate contact region 311 (although not shown in side view). In some embodiments, recesses 125 are formed using timed selective etch techniques. Recesses 125 are between adjacent ones of dielectric layers 105 such that dielectric layers 105 are on opposite surfaces (e.g., surfaces in the x-y plane) of one of semiconductor channel layer 102 and dielectric layers 105 extend beyond an edge of the semiconductor channel layer 102 to encompass the recess. Such recessing provides a location for the subsequent growth of a dielectric material to insulate semiconductor channel layers 102 from shorting to gate metallization.

Figure 14A:
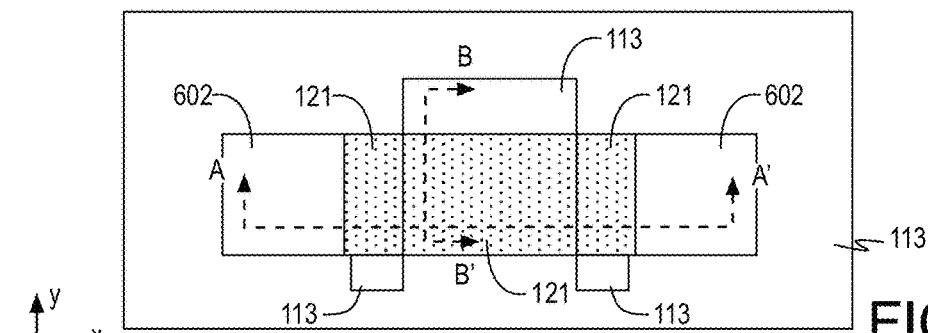
Figure 14B:
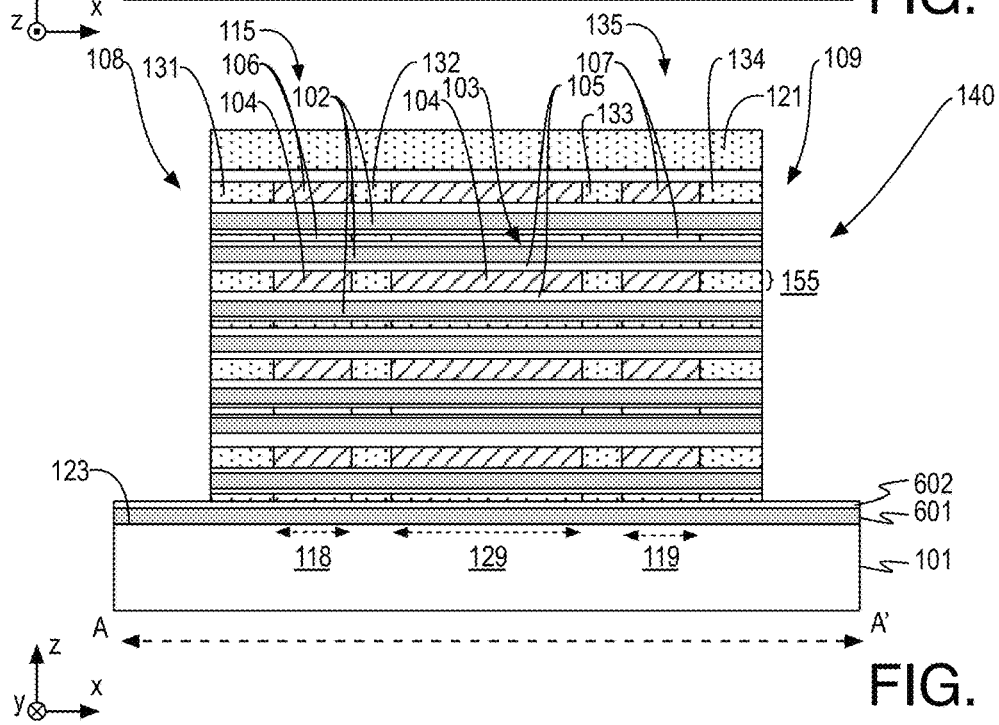
Figure 14C:
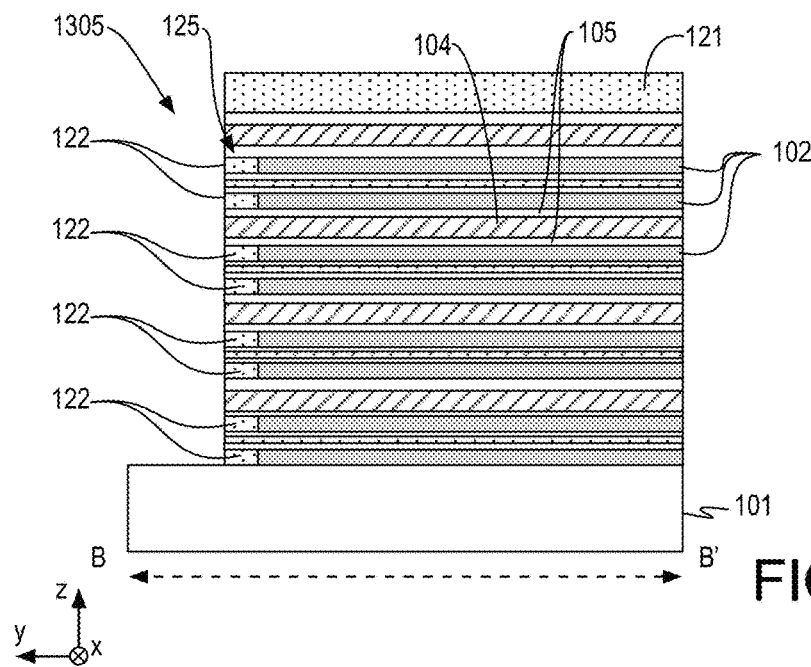

FIGS. 14A, 14B, and 14C illustrate an example transistor structure 1400 similar to transistor structure 1300, after filling recesses 125 with dielectric fills or plugs 122. For example, each of recesses 125 are filled with one of dielectric fills or plugs 122, including those adjacent source control gate contact region 310 and drain control gate contact region 311. Dielectric fills or plugs 122 are formed using any suitable technique or techniques such as selective growth techniques or growth and patterning techniques or the like. For example, dielectric fills or plugs 122 may be deposited with a chemistry that provides selective growth on dielectric layers 105. Such growth may be localized to recesses 125 or such growth may extend laterally from the sidewalls including sidewall 1305 (lateral growth not shown). In such examples, patterning or selective etch back may be performed or such regions may remain. Dielectric fills 122 may include any dielectric material such as a low-k dielectric material. For example, dielectric fills or plugs 122 may have a lower dielectric constant than dielectric layers 105.

Figure 15A:
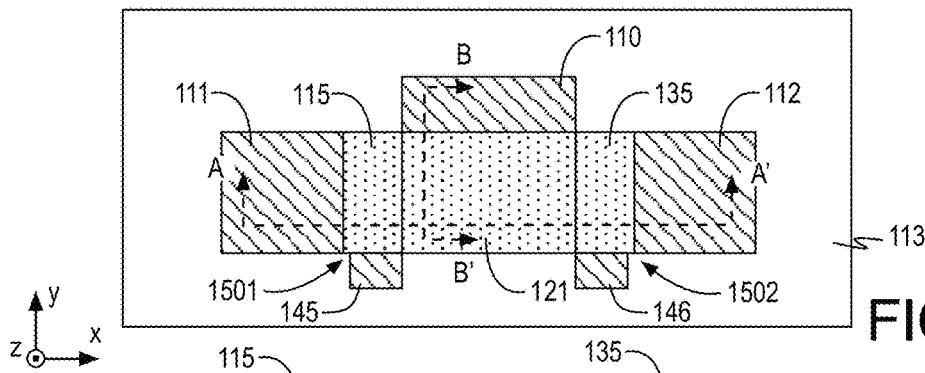
Figure 15B:
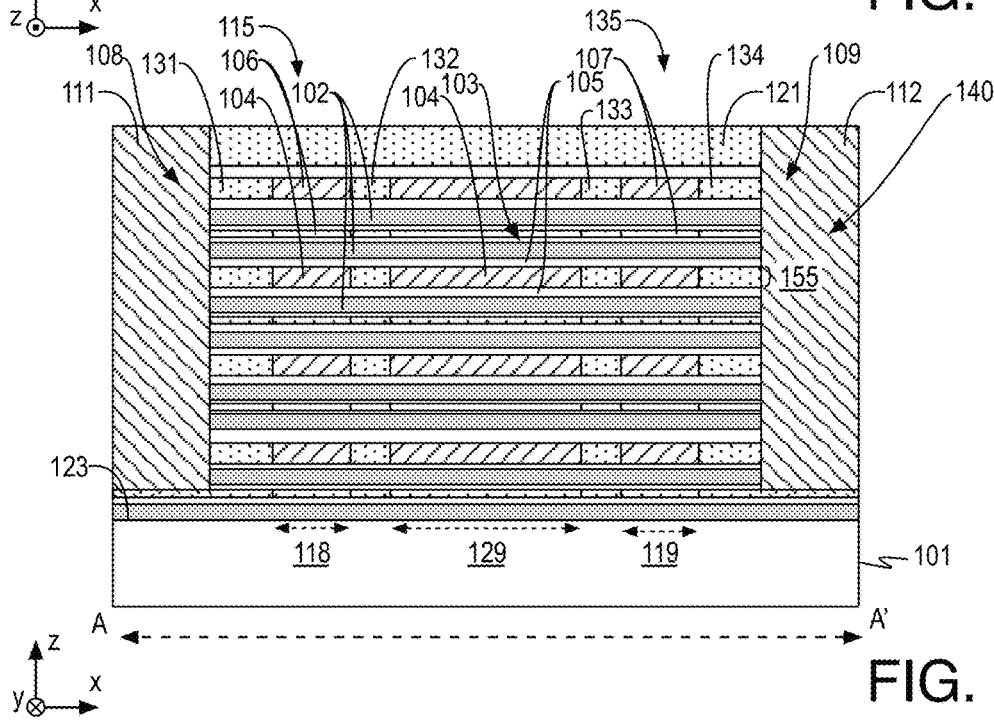
Figure 15C:
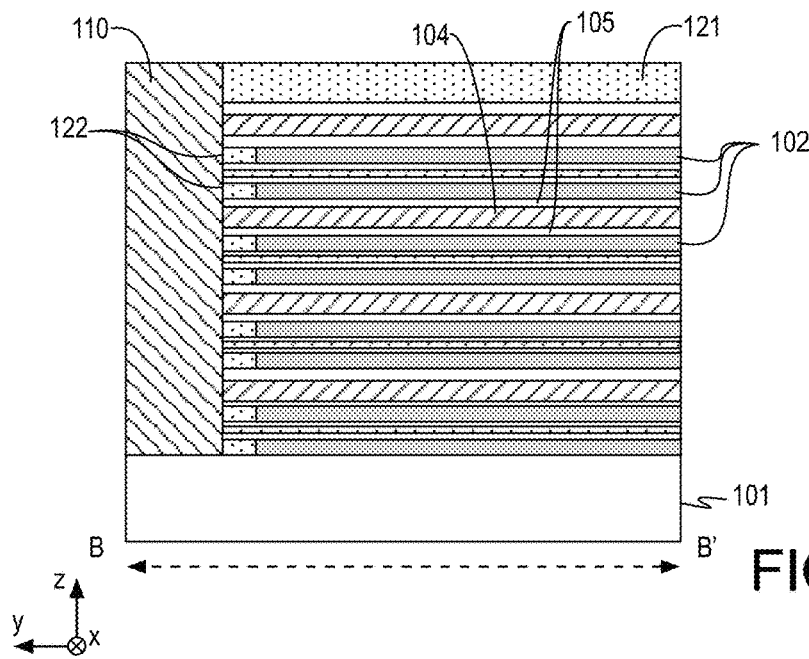

FIGS. 15A, 15B, and 15C illustrate an example transistor structure 1500 similar to transistor structure 1500, after landing source contact 111 in source region 305, drain contact 112 in drain region 307, gate contact 110 in gate region 308, source control gate contact 145 in source control gate contact region 310, and drain control gate contact 146 in drain control gate contact region 311. Notably, a gap 1501 is provided between source contact 111 and source control gate contact 145 and a gap 1502 is provided between drain contact 112 and drain control gate contact 146. Such gaps 1501, 1502 (or underlaps) ensure no shorting between control gate contact 145, 146 (e.g., control gates) and contacts, 111, 112 (e.g., contact plugs).

Such contacts 110, 111, 112, 145, 146 may have any characteristics discussed herein. Furthermore, contacts 110, 111, 112, 145, 146 may be formed using any suitable technique or techniques such as metal fill or deposition techniques followed by planarization techniques. In the illustrated example, contacts 110, 111, 112, 145, 146 are formed in the same operations steps and may include the same material(s). In other embodiments, source contact 111 and drain contact 112 may have been previously formed and such gate region and control gate region opening, recess processing, and dielectric plug processing is applied with source contact 111 and drain contact 112 in place. Subsequently gate contact 110 and source and drain control gate contacts 145, 146 are formed. In such examples, source contact 111 and drain contact 112 may include the same material(s) while gate contact 110 and source and drain control gate contacts 145, 146 have differing material(s). It is noted that transistor structure 1500 substantially matches transistor structure 100 and may have any characteristics discussed therewith. Other techniques for forming contacts 110, 111, 112, 145, 146, as well as other structures of transistor structure 100 are available. Notably, the order of such operations may be provided in alternative orders, some operations may be added, or some operations may be omitted.

The techniques discussed herein advantageously provide an integration scheme that allows for both stacked transistor channels and secondary gate contacts, which is fully compatible with 2D semiconductor materials. For example, 2D semiconductors may be used for back end of line (BEOL) and/or logic applications inclusive of such as power delivery devices or more compact logic gates. Such contact gate architectures can enable reduce contact resistance as well as complex logic gate architectures.

Figure 16:
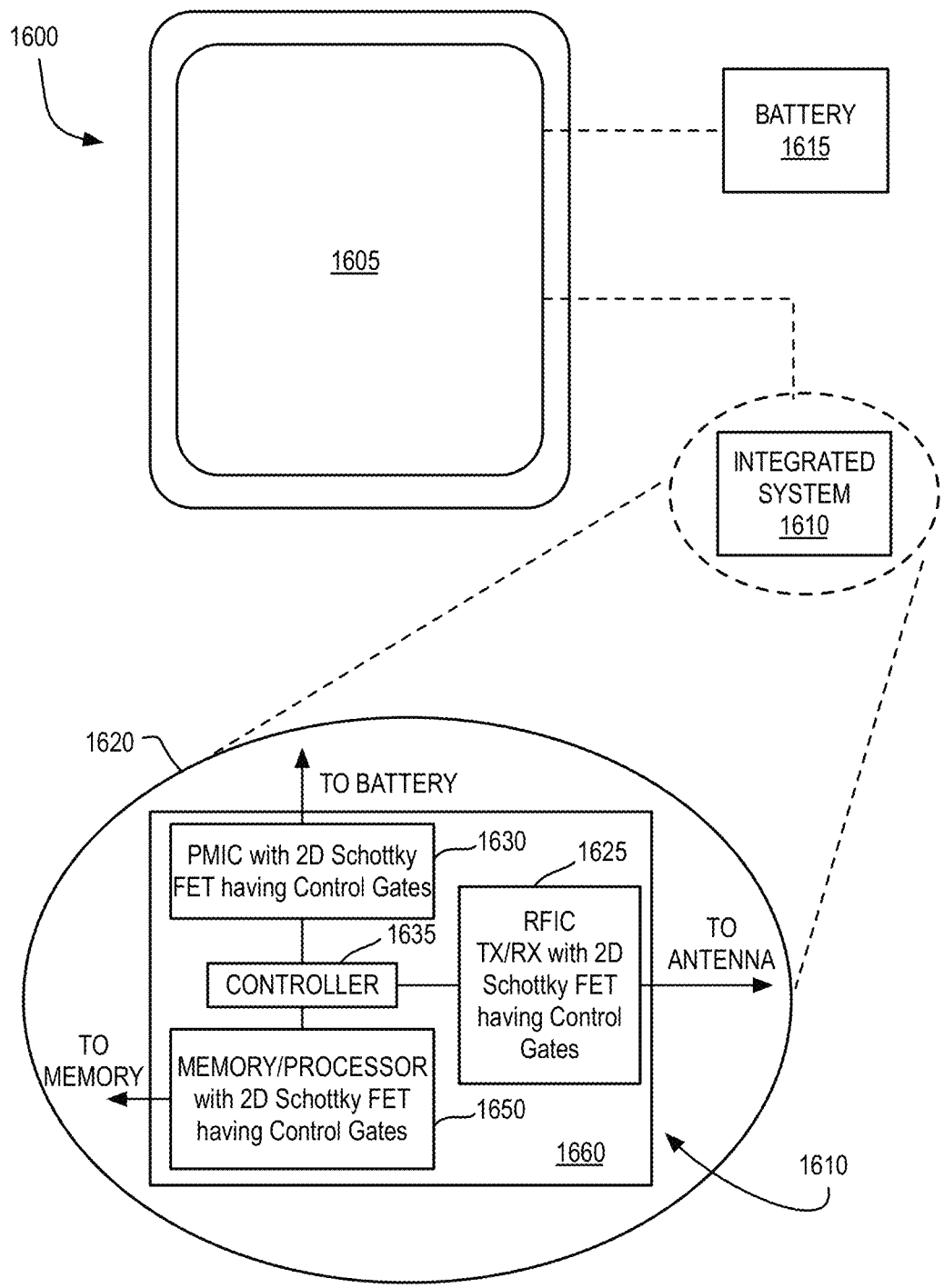
FIG. 16 is an illustrative diagram of a mobile computing platform employing a device having source and drain control electrodes to control semiconductor material in source and drain regions.

FIG. 16 is an illustrative diagram of a mobile computing platform 1600 employing a device including a transistor having source and drain control electrodes to control semiconductor material in source and drain regions, arranged in accordance with at least some implementations of the present disclosure. Any die or device having a transistor structure inclusive of any components, materials, or characteristics discussed herein may be implemented by any component of mobile computing platform 1600. Mobile computing platform 1600 may be any portable device configured for each of electronic data display, electronic data processing, wireless electronic data transmission, or the like. For example, mobile computing platform 1600 may be any of a tablet, a smart phone, a netbook, a laptop computer, etc. and may include a display screen 1605, which in the exemplary embodiment is a touchscreen (e.g., capacitive, inductive, resistive, etc. touchscreen), a chip-level (system on chip—SoC) or package-level integrated system 1610, and a battery 1615. Battery 1615 may include any suitable device for providing electrical power such as a device consisting of one or more electrochemical cells and electrodes to couple to an outside device. Mobile computing platform 1600 may further include a power supply to convert a source power from a source voltage to one or more voltages employed by other devices of mobile computing platform 1600.

Integrated system 1610 is further illustrated in the expanded view 1620. In the exemplary embodiment, packaged device 1650 (labeled "Memory/Processor" in FIG. 16) includes at least one memory chip (e.g., RAM), and/or at least one processor chip (e.g., a microprocessor, a multi-core microprocessor, or graphics processor, or the like). In an embodiment, the package device 1650 is a microprocessor including an SRAM cache memory. As shown, device 1650 may employ a die or device having any transistor structures and/or related characteristics discussed herein. Packaged device 1650 may be further coupled to (e.g., communicatively coupled to) a board, a substrate, or an interposer 1660 along with, one or more of a power management integrated circuit (PMIC) 1630, RF (wireless) integrated circuit (RFIC) 1625 including a wideband RF (wireless) transmitter and/or receiver (TX/RX) (e.g., including a digital baseband and an analog front end module further comprises a power amplifier on a transmit path and a low noise amplifier on a receive path), and a controller 1635 thereof. In general, packaged device 1650 may be also be coupled to (e.g., communicatively coupled to) display screen 1605. As shown, one or both of PMIC 1630 and/or RFIC 1625 may employ a die or device having any transistor structures and/or related characteristics discussed herein.

Functionally, PMIC 1630 may perform battery power regulation, DC-to-DC conversion, etc., and so has an input coupled to battery 1615 and with an output providing a current supply to other functional modules. In an embodiment, PMIC 1630 may perform high voltage operations. As further illustrated, in the exemplary embodiment, RFIC 1625 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 1650 or within a single IC (SoC) coupled to the package substrate of the packaged device 1650.

Figure 17:
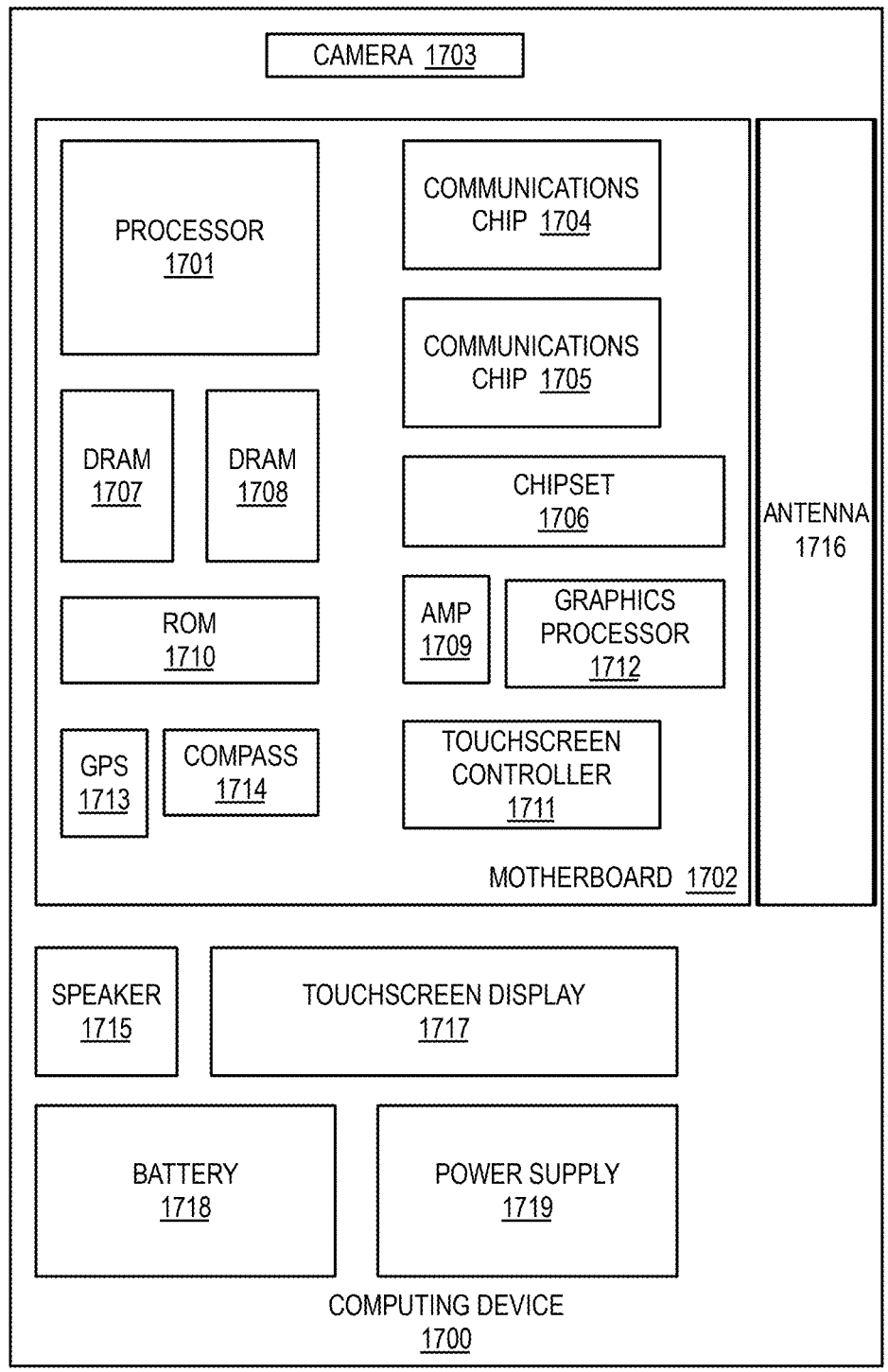
FIG. 17 is a functional block diagram of a computing device, all arranged in accordance with at least some implementations of the present disclosure.

FIG. 17 is a functional block diagram of a computing device 1700, arranged in accordance with at least some implementations of the present disclosure. Computing device 1700 may be found inside platform 1600, for example, and further includes a motherboard 1702 hosting a number of components, such as but not limited to a processor 1701 (e.g., an applications processor) and one or more communications chips 1704, 1705. Processor 1701 may be physically and/or electrically coupled to motherboard 1702. In some examples, processor 1701 includes an integrated circuit die packaged within the processor 1701. In general, the term "processor" may refer to any device or portion of a device that processes electronic data from registers and/or memory to transform that electronic data into other electronic data that may be stored in registers and/or memory. Any one or more device or component of computing device 1700 may include a die or device having any transistor structures and/or related characteristics as discussed herein.

In various examples, one or more communication chips 1704, 1705 may also be physically and/or electrically coupled to the motherboard 1702. In further implementations, communication chips 1704 may be part of processor 1701. Depending on its applications, computing device 1700 may include other components that may or may not be physically and electrically coupled to motherboard 1702. These other components may include, but are not limited to, volatile memory (e.g., DRAM) 1707, 1708, non-volatile memory (e.g., ROM) 1710, a graphics processor 1712, flash memory, global positioning system (GPS) device 1713, compass 1714, a chipset 1706, an antenna 1716, a power amplifier 1709, a touchscreen controller 1711, a touchscreen display 1717, a speaker 1715, a camera 1703, a battery 1718, and a power supply 1719, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1704, 1705 may enable wireless communications for the transfer of data to and from the computing device 1700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1704, 1705 may implement any of a number of wireless standards or protocols, including but not limited to those described elsewhere herein. As discussed, computing device 1700 may include a plurality of communication chips 1704, 1705. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 1719 may convert a source power from a source voltage to one or more voltages employed by other devices of mobile computing platform 1600. In some embodiments, power supply 1719 converts an AC power to DC power. In some embodiments, power supply 1719 converts an DC power to DC power at one or more different (lower) voltages. In some embodiments, multiple power supplies are staged to convert from AC to DC and then from DC at a higher voltage to DC at a lower voltage as specified by components of computing device 1700.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In one or more first embodiments, a transistor structure comprises a plurality of semiconductor channel layers interleaved with a plurality of gate layers, each of the plurality of gate layers comprising a gate electrode layer between two dielectric layers, wherein the semiconductor channel layers comprise a 2D material, a source contact on a first lateral end of the semiconductor channel layers and a drain contact on a second lateral end of the semiconductor channel layers opposite the first lateral end, a plurality of source or drain control electrodes each coplanar with one of the gate electrode layers, laterally between the source or drain contact and the gate electrode layers, and vertically overlapping regions of the semiconductor channel layers and the dielectric layers, the source or drain control electrodes laterally separated from the gate electrode layers by dielectric fill materials, a gate contact coupled to the gate electrode layers, and a control gate contact coupled to the source or drain control electrodes.

In one or more second embodiments, further to the first embodiment, the source or drain control electrodes extend laterally from the control gate contact across the overlapping regions of the semiconductor channel layers and substantially orthogonal to the semiconductor channel layers.

In one or more third embodiments, further to the first or second embodiments, the dielectric layers extend from the source contact to the drain contact and a first of the dielectric layers separates a first of the source or drain control electrodes from a first of the semiconductor channel layers at a first region of the first dielectric layer and separates a first of the gate electrode layers from the first of the semiconductor channel layers at a second region of the first dielectric layer.

In one or more fourth embodiments, further to any of the first through third embodiments, a second of the dielectric layers is opposite the first source or drain control electrode and the first gate electrode layer with respect to the first dielectric layer, the second dielectric layer between the first source or drain control electrode and the first gate electrode layer and a second of the semiconductor channel layers.

In one or more fifth embodiments, further to any of the first through fourth embodiments, the plurality of source or drain control electrodes comprises source control electrodes, the transistor structure further comprising a plurality of drain control electrodes, wherein a first layer of the transistor structure extending laterally from the source contact to the drain contact comprises a first dielectric material, one of the source control electrodes, one of the dielectric fill materials, one of the gate electrode layers, a second dielectric material, one of the drain control electrodes, and a third dielectric material.

In one or more sixth embodiments, further to any of the first through fifth embodiments, the first layer of the transistor structure is substantially parallel to one of the semiconductor channel layers that extends from the source contact to the drain contact, the first layer separated from the one of the semiconductor channel layers by one of the dielectric layers.

In one or more seventh embodiments, further to any of the first through sixth embodiments, the source or drain control electrodes and the gate electrode layers comprise the same material.

In one or more eighth embodiments, further to any of the first through seventh embodiments, the 2D material comprises one of a transition metal and a chalcogen or indium and selenium.

In one or more ninth embodiments, further to any of the first through eighth embodiments, the 2D material comprises the transition metal and the chalcogen, wherein the transition metal comprises at least one of molybdenum or tungsten and the chalcogen comprises at least one of sulfur or selenium.

In one or more tenth embodiments, a system comprises a power supply and an integrated circuit die coupled to the power supply, the integrated circuit die comprising a transistor structure according to any of the first through sixth embodiments.

In one or more eleventh embodiments, a method of fabricating a transistor structure comprises forming a material stack comprising a plurality of semiconductor channel layers interleaved with a plurality of gate layers, each of the plurality of gate layers comprising a gate electrode layer between two dielectric layers, wherein the semiconductor channel layers comprise a 2D material, forming first and second recesses of the gate electrode layers at opposite lateral ends of the material stack and filling first portions of the first and second recesses with a first dielectric material, providing source and drain control electrodes in second portions of the first and second recesses, filling third portions of the first and second recesses with a second dielectric material, and coupling source and drain contacts to the semiconductor channel layers at the opposite lateral ends of the material stack, a gate contact to the gate electrode layers, and source and drain control contacts to the source and drain control electrodes.

In one or more twelfth embodiments, further to the eleventh embodiment, coupling the gate contact to the gate electrode layers and the source and drain contacts to the source and drain control electrodes comprises forming third, fourth, and fifth recesses of the semiconductor channel layers and filling the third, fourth, and fifth recesses with a third dielectric material, wherein the third recesses are adjacent the source control contact, the fourth recesses are adjacent the source drain control contact.

In one or more thirteenth embodiments, further to the eleventh or twelfth embodiments, the dielectric layers extend from the source contact to the drain contact and a first of the dielectric layers separates a first of the source or drain control electrodes from a first of the semiconductor channel layers at a first region of the first dielectric layer and separates a first of the gate electrode layers from the first of the semiconductor channel layers at a second region of the first dielectric layer.

In one or more fourteenth embodiments, further to any of the eleventh through thirteenth embodiments, a second of the dielectric layers is opposite the first source or drain control electrode and the first gate electrode layer with respect to the first dielectric layer, the second dielectric layer between the first source or drain control electrode and the first gate electrode layer and a second of the semiconductor channel layers.

In one or more fifteenth embodiments, further to any of the eleventh through fourteenth embodiments, the 2D material comprises one of a transition metal and a chalcogen or indium and selenium.

In one or more sixteenth embodiments, further to any of the eleventh through fifteenth embodiments, forming the material stack comprises forming an alternating stack of first and second sacrificial layers over a substrate, removing the first sacrificial layers, forming the semiconductor channel layers, each on an exposed surface of the second sacrificial layers, forming first dielectric layers on the semiconductor channel layers, and forming first gate electrode layers on the first dielectric layers, removing the second sacrificial layers, and forming second dielectric layers on the semiconductor channel layers, and forming second gate electrode layers on the second dielectric layers.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor structure, comprising:
    a plurality of semiconductor channel layers interleaved with a plurality of gate layers, each of the plurality of gate layers comprising a gate electrode layer between two dielectric layers, wherein the semiconductor channel layers comprise a 2D material;
    a source contact on a first lateral end of the semiconductor channel layers and a drain contact on a second lateral end of the semiconductor channel layers opposite the first lateral end;
    a plurality of source or drain control electrodes each coplanar with one of the gate electrode layers, laterally between the source or drain contact and the gate electrode layers, and vertically overlapping regions of the semiconductor channel layers and the dielectric layers, the source or drain control electrodes laterally separated from the gate electrode layers by dielectric fill materials;
    a gate contact coupled to the gate electrode layers; and
    a control gate contact coupled to the source or drain control electrodes.

2. The transistor structure of claim 1, wherein the source or drain control electrodes extend laterally from the control gate contact across the overlapping regions of the semiconductor channel layers and substantially orthogonal to the semiconductor channel layers.

3. The transistor structure of claim 1, wherein the dielectric layers extend from the source contact to the drain contact and a first of the dielectric layers separates a first of the source or drain control electrodes from a first of the semiconductor channel layers at a first region of the first dielectric layer and separates a first of the gate electrode layers from the first of the semiconductor channel layers at a second region of the first dielectric layer.

4. The transistor structure of claim 3, wherein a second of the dielectric layers is opposite the first source or drain control electrode and the first gate electrode layer with respect to the first dielectric layer, the second dielectric layer between the first source or drain control electrode and the first gate electrode layer and a second of the semiconductor channel layers.

5. The transistor structure of claim 1, wherein the plurality of source or drain control electrodes comprises source control electrodes, the transistor structure further comprising a plurality of drain control electrodes, wherein a first layer of the transistor structure extending laterally from the source contact to the drain contact comprises a first dielectric material, one of the source control electrodes, one of the dielectric fill materials, one of the gate electrode layers, a second dielectric material, one of the drain control electrodes, and a third dielectric material.

6. The transistor structure of claim 5, wherein the first layer of the transistor structure is substantially parallel to one of the semiconductor channel layers that extends from the source contact to the drain contact, the first layer separated from the one of the semiconductor channel layers by one of the dielectric layers.

7. The transistor structure of claim 1, wherein the source or drain control electrodes and the gate electrode layers comprise the same material.

8. The transistor structure of claim 1, wherein the 2D material comprises one of a transition metal and a chalcogen or indium and selenium.

9. The transistor structure of claim 8, wherein the 2D material comprises the transition metal and the chalcogen, wherein the transition metal comprises at least one of molybdenum or tungsten and the chalcogen comprises at least one of sulfur or selenium.

10. A system comprising:
a power supply;
an integrated circuit die coupled to the power supply, the integrated circuit die comprising a transistor structure comprising:
a plurality of semiconductor channel layers interleaved with a plurality of gate layers, each of the plurality of gate layers comprising a gate electrode layer between two dielectric layers, wherein the semiconductor channel layers comprise a 2D material;
a source contact on a first lateral end of the semiconductor channel layers and a drain contact on a second lateral end of the semiconductor channel layers opposite the first lateral end;
a plurality of source or drain control electrodes each coplanar with one of the gate electrode layers, laterally between the source or drain contact and the gate electrode layers, and vertically overlapping regions of the semiconductor channel layers and the dielectric layers, the source or drain control electrodes laterally separated from the gate electrode layers by dielectric fill materials;
a gate contact coupled to the gate electrode layers; and
a control gate contact coupled to the source or drain control electrodes.

11. The system of claim 10, wherein the source or drain control electrodes extend laterally from the control gate contact across the overlapping regions of the semiconductor channel layers and substantially orthogonal to the semiconductor channel layers.

12. The system of claim 10, wherein the dielectric layers extend from the source contact to the drain contact and a first of the dielectric layers separates a first of the source or drain control electrodes from a first of the semiconductor channel layers at a first region of the first dielectric layer and separates a first of the gate electrode layers from the first of the semiconductor channel layers at a second region of the first dielectric layer.

13. The system of claim 10, wherein the plurality of source or drain control electrodes comprises source control electrodes, the transistor structure further comprising a plurality of drain control electrodes, wherein a first layer of the transistor structure extending laterally from the source contact to the drain contact comprises a first dielectric material, one of the source control electrodes, one of the dielectric fill materials, one of the gate electrode layers, a second dielectric material, one of the drain control electrodes, and a third dielectric material.

14. The system of claim 10, wherein the 2D material comprises one of a transition metal and a chalcogen or indium and selenium.

15. The system of claim 14, wherein the 2D material comprises the transition metal and the chalcogen, wherein the transition metal comprises at least one of molybdenum or tungsten and the chalcogen comprises at least one of sulfur or selenium.

16. A method of fabricating a transistor structure comprising:
forming a material stack comprising a plurality of semiconductor channel layers interleaved with a plurality of gate layers, each of the plurality of gate layers comprising a gate electrode layer between two dielectric layers, wherein the semiconductor channel layers comprise a 2D material;
forming first and second recesses of the gate electrode layers at opposite lateral ends of the material stack and filling first portions of the first and second recesses with a first dielectric material;
providing source and drain control electrodes in second portions of the first and second recesses;
filling third portions of the first and second recesses with a second dielectric material; and
coupling source and drain contacts to the semiconductor channel layers at the opposite lateral ends of the material stack, a gate contact to the gate electrode layers, and source and drain control contacts to the source and drain control electrodes.

17. The method of claim 16, wherein coupling the gate contact to the gate electrode layers and the source and drain contacts to the source and drain control electrodes comprises:
forming third, fourth, and fifth recesses of the semiconductor channel layers and filling the third, fourth, and fifth recesses with a third dielectric material, wherein the third recesses are adjacent the source control contact, the fourth recesses are adjacent the source drain control contact.

18. The method of claim 16, wherein the dielectric layers extend from the source contact to the drain contact and a first of the dielectric layers separates a first of the source or drain control electrodes from a first of the semiconductor channel layers at a first region of the first dielectric layer and separates a first of the gate electrode layers from the first of the semiconductor channel layers at a second region of the first dielectric layer.

19. The method of claim 18, wherein a second of the dielectric layers is opposite the first source or drain control electrode and the first gate electrode layer with respect to the first dielectric layer, the second dielectric layer between the first source or drain control electrode and the first gate electrode layer and a second of the semiconductor channel layers.

20. The method of claim 16, wherein the 2D material comprises one of a transition metal and a chalcogen or indium and selenium.

21. The method of claim 16, wherein forming the material stack comprises:
   forming an alternating stack of first and second sacrificial layers over a substrate;
   removing the first sacrificial layers;
   forming the semiconductor channel layers, each on an exposed surface of the second sacrificial layers, forming first dielectric layers on the semiconductor channel layers, and forming first gate electrode layers on the first dielectric layers;
   removing the second sacrificial layers; and
   forming second dielectric layers on the semiconductor channel layers, and forming second gate electrode layers on the second dielectric layers.

\* \* \* \* \*